(12) United States Patent
Masnaghetti et al.

(10) Patent No.: US 10,643,819 B2
(45) Date of Patent: May 5, 2020

(54) METHOD AND SYSTEM FOR CHARGED PARTICLE MICROSCOPY WITH IMPROVED IMAGE BEAM STABILIZATION AND INTERROGATION

(71) Applicant: KLA-Tencor Corporation, Milpitas, CA (US)

(72) Inventors: Doug K. Masnaghetti, San Jose, CA (US); Gabor Toth, San Jose, CA (US); David Trease, Milpitas, CA (US); Rohit Bothra, Milpitas, CA (US); Grace Hsiu-Ling Chen, Los Gatos, CA (US); Rainer Knippelmeyer, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 787 days.

(21) Appl. No.: 15/079,046

(22) Filed: Mar. 24, 2016

(65) Prior Publication Data
US 2016/0372304 A1    Dec. 22, 2016

Related U.S. Application Data

(60) Provisional application No. 62/137,229, filed on Mar. 24, 2015, provisional application No. 62/166,682, (Continued)

(51) Int. Cl.
*H01J 31/28*    (2006.01)
*H01J 37/244*    (2006.01)
(Continued)

(52) U.S. Cl.
CPC ............ *H01J 37/28* (2013.01); *G01N 23/203* (2013.01); *H01J 37/10* (2013.01); *H01J 37/244* (2013.01);
(Continued)

(58) Field of Classification Search
CPC .......... H01J 37/28; H01J 37/10; H01J 37/244; H01J 2237/2806; H01J 2237/057;
(Continued)

(56) References Cited

U.S. PATENT DOCUMENTS 4,179,604 A * 12/1979 Christou ................... G01T 1/20
250/305
4,864,228 A    9/1989 Richardson
(Continued)

FOREIGN PATENT DOCUMENTS

CN    101630623 A    1/2010
CN    103531426 A    1/2014
(Continued)

OTHER PUBLICATIONS

Office Action dated Dec. 4, 2018 for Chinese Patent Application No. 201680013667.2.
(Continued)

*Primary Examiner* — Brooke Purinton
(74) *Attorney, Agent, or Firm* — Suiter Swantz pc llo

(57) ABSTRACT

A scanning electron microscopy system with improved image beam stability is disclosed. The system includes an electron beam source configured to generate an electron beam and a set of electron-optical elements to direct at least a portion of the electron beam onto a portion of the sample. The system includes an emittance analyzer assembly. The system includes a splitter element configured to direct at least a portion secondary electrons and/or backscattered electrons emitted by a surface of the sample to the emittance analyzer assembly. The emittance analyzer assembly is configured to image at least one of the secondary electrons and/or the backscattered electrons.

28 Claims, 30 Drawing Sheets

Related U.S. Application Data filed on May 27, 2015, provisional application No. 62/214,737, filed on Sep. 4, 2015, provisional application No. 62/277,670, filed on Jan. 1, 2016.

(51) Int. Cl.
*H01J 37/10* (2006.01)
*H01J 37/28* (2006.01)
*G01N 23/203* (2006.01)

(52) U.S. Cl.
CPC .............. *G01N 2223/6116* (2013.01); *H01J 2237/0044* (2013.01); *H01J 2237/0048* (2013.01); *H01J 2237/057* (2013.01); *H01J 2237/2448* (2013.01); *H01J 2237/2449* (2013.01); *H01J 2237/24465* (2013.01); *H01J 2237/24475* (2013.01); *H01J 2237/24485* (2013.01); *H01J 2237/2804* (2013.01); *H01J 2237/2806* (2013.01)

(58) Field of Classification Search
CPC ....... H01J 2237/2804; H01J 2237/2449; H01J 2237/24485; H01J 2237/2448; H01J 2237/24475; H01J 2237/24465; H01J 2237/0048; H01J 2237/0044; G01N 23/203; G01N 2223/6116
See application file for complete search history.

(56) References Cited

U.S. PATENT DOCUMENTS

| | | | |
|---|---|---|---|
| 5,097,127 A | 3/1992 | Hildenbrand et al. | |
| 5,210,487 A | 5/1993 | Takahashi et al. | |
| 6,344,750 B1 | 2/2002 | Lo et al. | |
| 6,483,120 B1 | 11/2002 | Yui et al. | |
| 6,545,277 B1 | 4/2003 | Kella et al. | |
| 6,570,154 B1 | 5/2003 | Masnaghetti et al. | |
| 6,627,886 B1 | 9/2003 | Shachal et al. | |
| 6,730,907 B1* | 5/2004 | Feuerbaum ........... H01J 37/244 250/307 | |
| 6,784,425 B1 | 8/2004 | Lorusso et al. | |
| 6,797,955 B1 | 9/2004 | Adler et al. | |
| 6,844,550 B1 | 1/2005 | Yin et al. | |
| 6,897,458 B2 | 5/2005 | Wieland et al. | |
| 6,979,824 B1 | 12/2005 | Adler et al. | |
| 7,019,292 B1 | 3/2006 | Fan et al. | |
| 7,041,976 B1 | 5/2006 | Neil et al. | |
| 7,075,078 B2 | 7/2006 | Ose et al. | |
| 7,141,791 B2 | 11/2006 | Masnaghetti et al. | |
| 7,276,694 B1 | 10/2007 | Bertsche | |
| 7,335,879 B2 | 2/2008 | Chen | |
| 7,656,171 B2 | 2/2010 | Honda et al. | |
| 7,683,317 B2 | 3/2010 | Shemesh | |
| 7,705,301 B2 | 4/2010 | Tseng et al. | |
| 7,714,287 B1 | 5/2010 | James et al. | |
| 7,755,043 B1 | 7/2010 | Gubbens | |
| 7,838,833 B1 | 11/2010 | Lent et al. | |
| 8,203,119 B2 | 6/2012 | Degenhardt et al. | |
| 8,263,934 B2 | 9/2012 | Yamazaki et al. | |
| 8,274,048 B2 | 9/2012 | Ikegami et al. | |
| 8,288,724 B2 | 10/2012 | Kooijman et al. | |
| 8,421,027 B2* | 4/2013 | Barkshire ............... H01J 37/05 250/396 R | |
| 8,884,224 B2 | 11/2014 | Fang et al. | |
| 8,890,068 B2 | 11/2014 | Kasai et al. | |
| 8,946,649 B2 | 2/2015 | Sasaki et al. | |
| 8,963,083 B2 | 2/2015 | Firnkes et al. | |
| 9,000,395 B2 | 4/2015 | Ren et al. | |
| 9,048,062 B1 | 6/2015 | Ren et al. | |
| 9,048,063 B1 | 6/2015 | Ren et al. | |
| 9,165,742 B1 | 10/2015 | Simmons et al. | |
| 2003/0036264 A1 | 2/2003 | Ying et al. | |
| 2004/0051041 A1* | 3/2004 | Todokoro ............. G01N 23/225 250/310 | |
| 2006/0151711 A1 | 7/2006 | Frosien et al. | |
| 2007/0090288 A1 | 4/2007 | Shemesh | |
| 2007/0221846 A1 | 9/2007 | Todokoro et al. | |
| 2012/0241605 A1 | 9/2012 | Shemesh | |
| 2012/0273690 A1 | 11/2012 | Wieland et al. | |
| 2013/0032729 A1 | 2/2013 | Knippelmeyer | |
| 2013/0292568 A1 | 11/2013 | Bizen et al. | |
| 2014/0124666 A1 | 5/2014 | Sasaki et al. | |
| 2014/0175277 A1 | 6/2014 | Lanio | |
| 2014/0284476 A1 | 9/2014 | Ren et al. | |
| 2014/0299767 A1 | 10/2014 | Bizen et al. | |
| 2014/0353498 A1 | 12/2014 | Shur | |
| 2015/0034836 A1 | 2/2015 | Sohda et al. | |
| 2015/0049411 A1 | 2/2015 | Wang et al. | |
| 2017/0084421 A1 | 3/2017 | McCord et al. | |

FOREIGN PATENT DOCUMENTS

| | | |
|---|---|---|
| JP | 2006140267 A | 6/2006 |
| JP | 2006261111 A | 9/2006 |
| JP | 2009134926 A | 6/2009 |
| JP | 2015032360 A | 2/2015 |

OTHER PUBLICATIONS

International Search Report for Application No. PCT/US2016/024098 dated Jul. 1, 2016, 3 pages.
Office Action dated Dec. 17, 2019 for Japanese Patent Application No. 2017-549622.

* cited by examiner

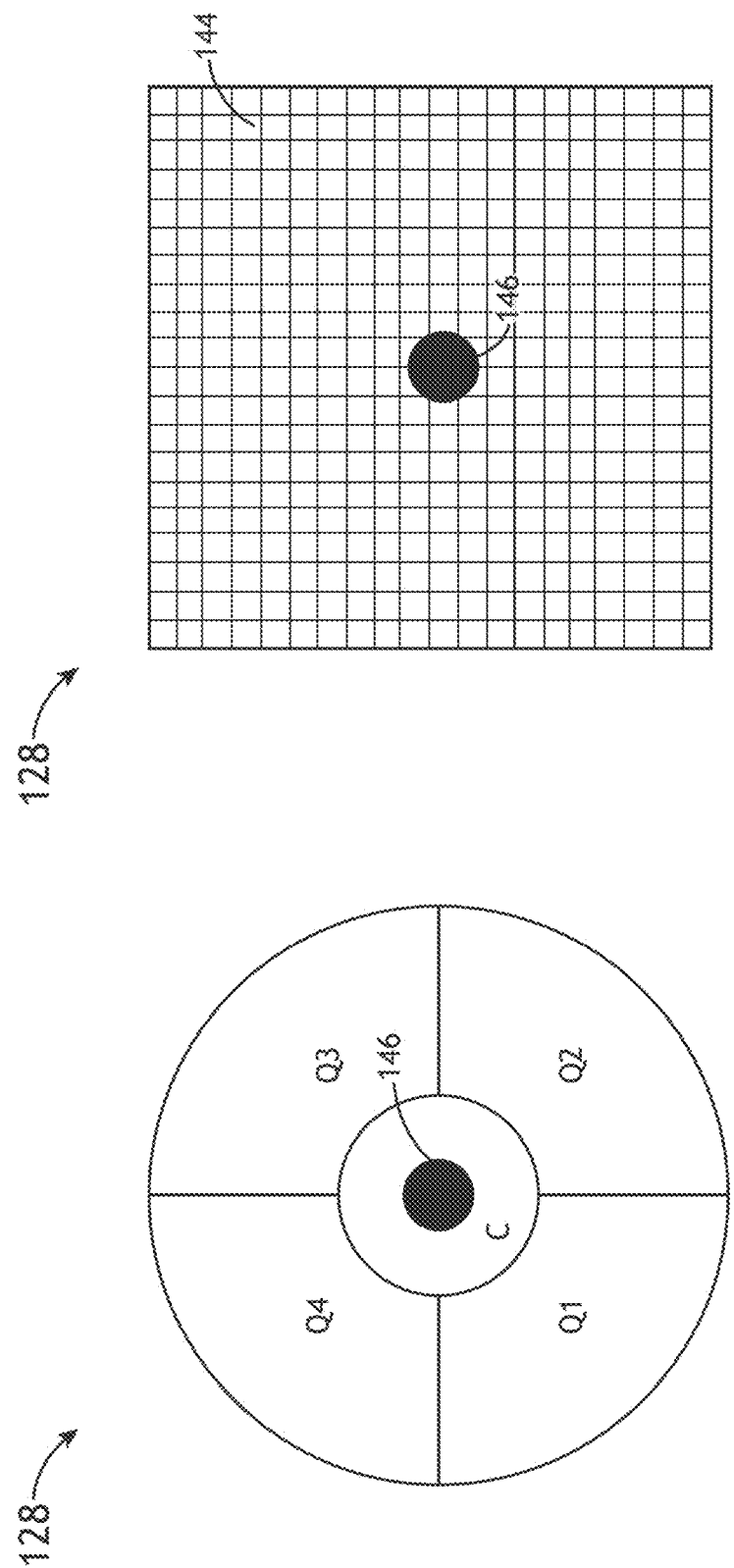

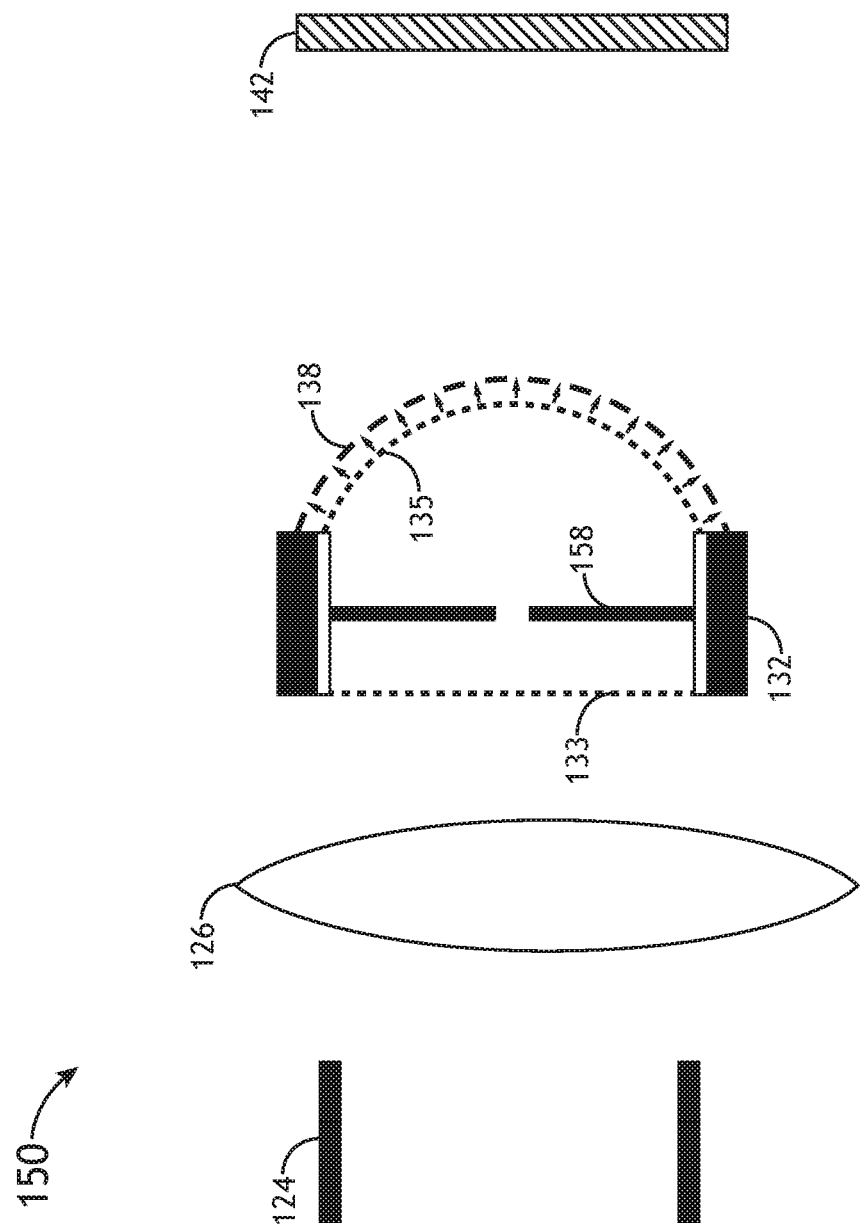

430

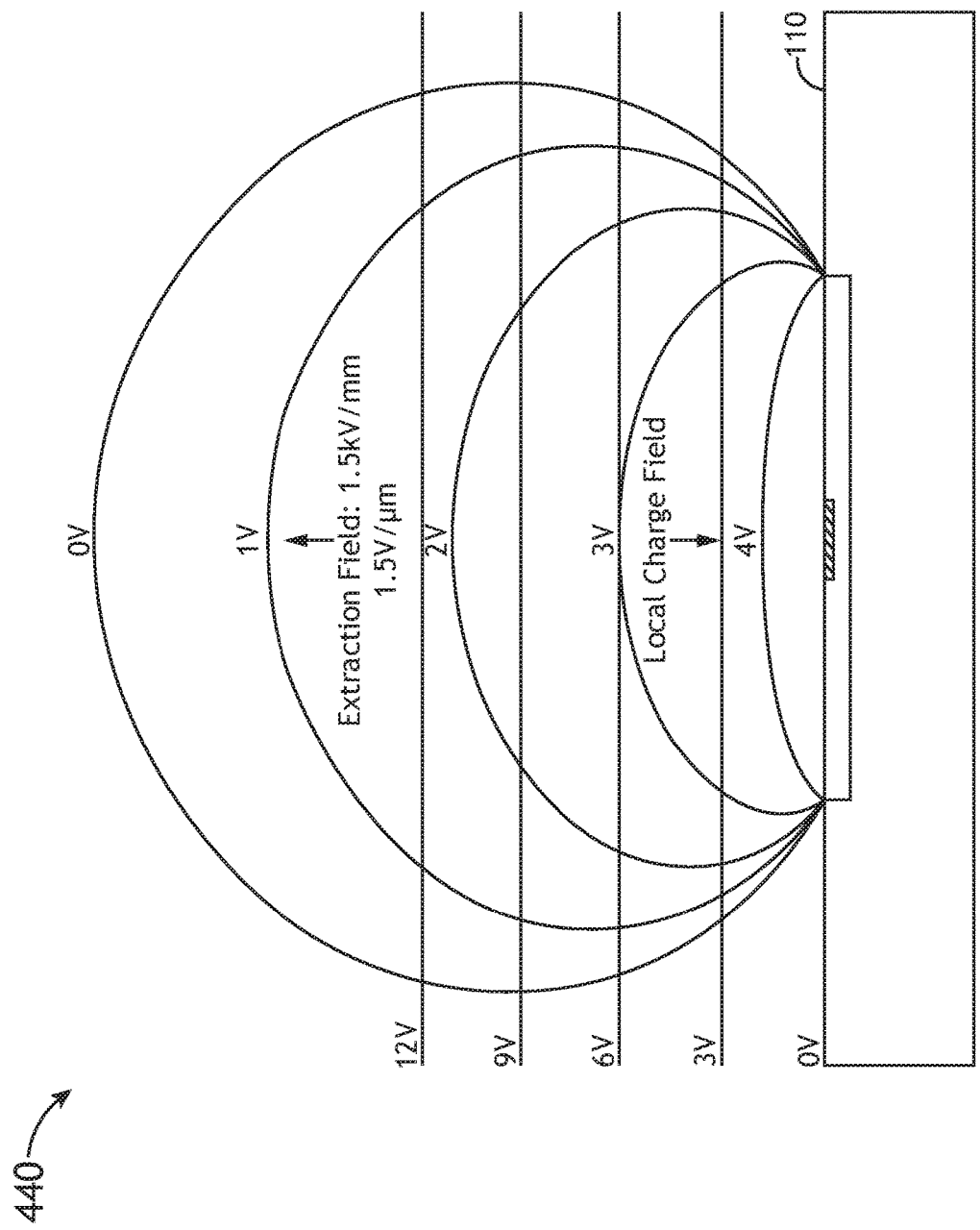

METHOD AND SYSTEM FOR CHARGED PARTICLE MICROSCOPY WITH IMPROVED IMAGE BEAM STABILIZATION AND INTERROGATION

CROSS-REFERENCE TO RELATED APPLICATION

The present application claims benefit under 35 U.S.C. § 119(e) and constitutes a regular (non-provisional) patent application of U.S. Provisional Application Ser. No. 62/137,229, filed Mar. 24, 2015; U.S. Provisional Application Ser. No. 62/166,682, filed May 27, 2015; U.S. Provisional Application Ser. No. 62/214,737, filed Sep. 4, 2015; and U.S. Provisional Application Ser. No. 62/277,670, filed Jan. 12, 2016, which are each incorporated herein by reference in their entirety.

TECHNICAL FIELD

The present invention generally relates to charged particle microscopy, and, in particular, to a scanning electron microscopy system with improved stabilization and interrogation of the image beam.

BACKGROUND

Fabricating semiconductor devices such as logic and memory devices typically includes processing a substrate such as a semiconductor wafer using a large number of semiconductor fabrication processes to form various features and multiple levels of the semiconductor devices. As semiconductor device size become smaller and smaller, it becomes critical to develop enhanced wafer inspection and review devices and procedures. As such, it would be advantageous to provide a system and method that provides improved electron imaging of samples, such as, semiconductor wafers.

SUMMARY

A scanning electron microscopy (SEM) apparatus is disclosed, in accordance with one or more embodiments of the present disclosure. In one illustrative embodiment, the SEM apparatus includes an electron beam source configured to generate an electron beam. In another illustrative embodiment, the SEM apparatus includes a set of electron-optical elements to direct at least a portion of the electron beam onto a portion of the sample. In another illustrative embodiment, the SEM apparatus includes an emittance analyzer assembly. In another illustrative embodiment, the SEM apparatus includes a splitter element configured to direct at least a portion of at least one of secondary electrons or backscattered electrons emitted by a surface of the sample to the emittance analyzer assembly. In another illustrative embodiment, the emittance analyzer assembly is configured to image at least one of the secondary electrons or the backscattered electrons. In another illustrative embodiment, the emittance analyzer assembly includes: a set of deflection optics; a first electron-optic lens; a first electron detector including a center aperture, wherein the first electron detector is configured to collect at least one of a portion of the secondary electrons or a portion of the backscattered electrons; a first mesh element disposed downstream from the first electron detector; a second mesh element disposed downstream from the first mesh element, wherein the first electron detector and the first mesh element form a deceleration region, wherein the first mesh element and the second mesh element form a drift region; an energy filter disposed downstream from the second ground mesh element; a second electron-optic lens; and a second electron detector configured to collect at least one of an additional portion of the secondary electrons or an additional portion of the backscattered electrons.

In another illustrative embodiment, the emittance analyzer is configured to operate in secondary electron and backscattered electron imaging mode. In another illustrative embodiment, the emittance analyzer is configured to operate in backscattered electron and high aspect ratio electron imaging mode. In another illustrative embodiment, the emittance analyzer is configured to operate in backscattered electron only imaging mode. In another illustrative embodiment, the emittance analyzer is configured to switch between the secondary electron and backscattered electron imaging mode, the backscattered electron and high aspect ratio electron imaging mode, and the backscattered electron only imaging mode.

In another illustrative embodiment, the electron source and/or a flood gun are configured to apply an in-situ flood pre-dose to the sample.

In another illustrative embodiment, the apparatus includes a gated integrator configured to lock one or more components of the emittance analyzer assembly to the surface potential of the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 6C, a system and method for performing scanning electron microscopy with improved stabilization and interrogation of the image beam is disclosed in accordance with the present disclosure.

Embodiments of the present disclosure are directed to an emittance analyzer assembly to extract information from an electron image beam from a sample surface. Further, the emittance analyzer assembly may be configured in a variety of configurations. As discussed throughout the present disclosure, the emittance analyzer assembly of the present disclosure may operate in a secondary electron/backscattered electron (SE-BSE) mode, a backscattered electron/high aspect ratio (BSE-HAR) mode and/or a BSE-only mode, whereby the system is capable of switching between the various analyzer modes. The emittance analyzer of the present disclosure also allows for real-time wafer surface potential acquisition during any mode of imaging. In addition, the emittance analyzer of the present disclosure allows for the generation of control signals to stabilize polar angle discrimination drift and image beam position drift when imaging wafers that develop surface voltages.

Additional embodiments of the present disclosure are directed to a gated integrator configured to lock image path optical elements to the surface potential of a given sample for purposes of improving image quality. Additional embodiments of the present disclosure are direct to the implementation of in-situ flood along with the emittance analyzer assembly and/or the gated integrator to stabilize the image beam.

The present disclosure includes embodiments at least partially discussed in the following U.S. Pat. Nos. 5,210,487, 6,483,120, 6,570,154, 6,784,425, 6,844,550, 6,897,458, 7,041,976, 7,075,078, 7,683,317, 7,705,301, 7,141,791, 7,656,171, 7,714,287, 8,203,119, 8,263,934, 8,274,048, 8,288,724, 8,421,027, 8,884,224, 8,890,068, 8,946,649, 8,963,083, 9,000,395, 9,048,062, 9,048,063, and 9,165,742, which are each incorporated herein by reference in their entirety. The present disclosure includes embodiments at least partially discussed in the following United States Patent Publications: 2007/0090288, 2012/0273690, 2013/0032729, 2014/0299767, and 2014/029967, which are each incorporated herein by reference in their entirety. The present disclosure includes embodiments at least partially discussed in U.S. patent application Ser. No. 14/696,122, which is incorporated herein by reference in the entirety.

Figure 1A:
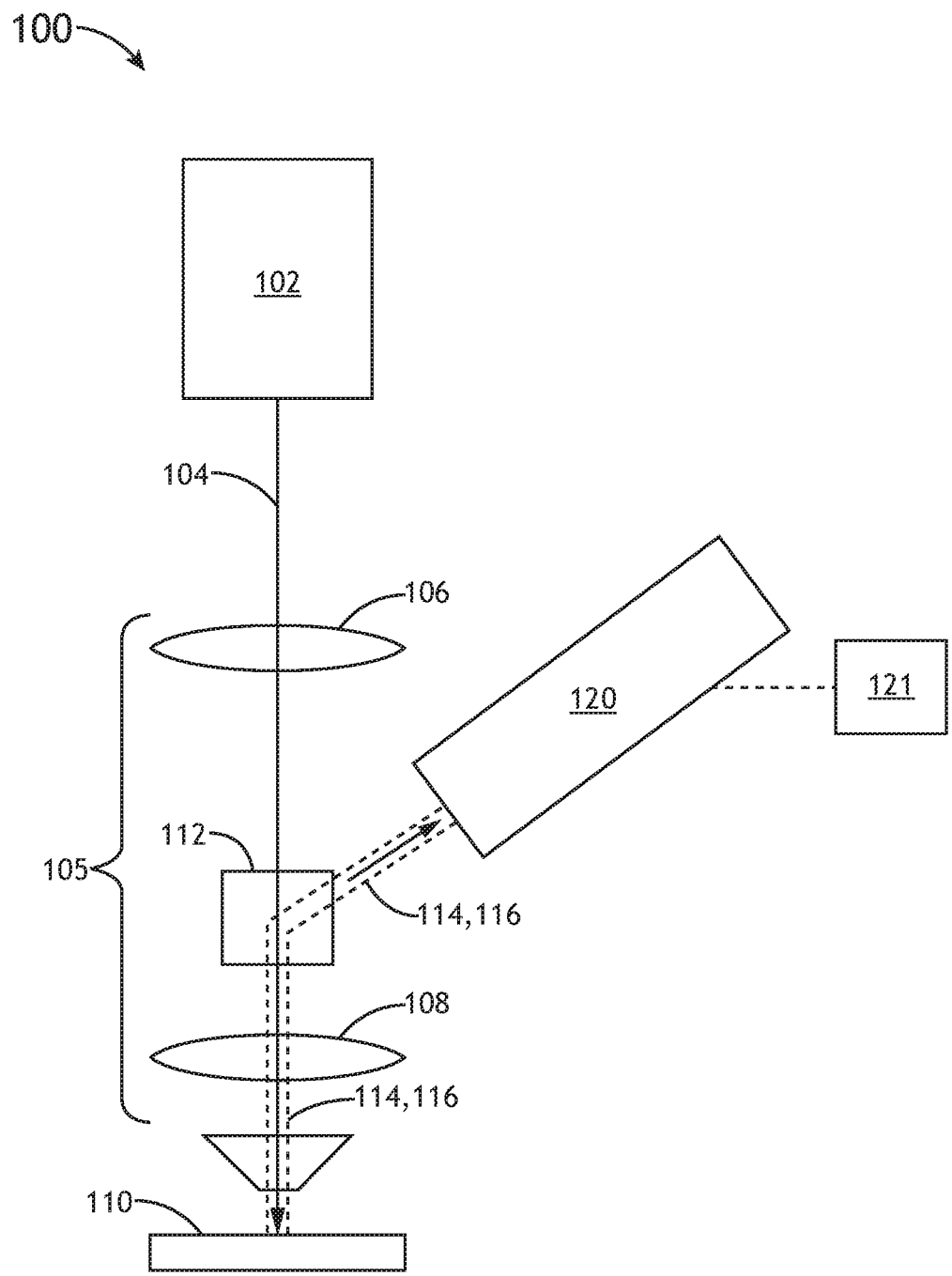
FIGS. 1A-6C illustrate one or more embodiments of a scanning electron microscopy system with improved stabilization and interrogation of the image beam, in accordance with the present disclosure.

FIG. 1A illustrates a charged particle imaging system 100 arranged for imaging a sample via a collection of secondary electrons and/or backscattered electrons, in accordance with one embodiment of the present disclosure.

In one embodiment, the system 100 includes an electron beam source 102, an electron-optical column 105, a splitter element 112, an emittance analyzer assembly 120 and controller 121.

The emittance analyzer assembly 120 serves to extract information from the image beam related to the emittance of the microscopy system 100. The image beam includes backscattered electrons 114 and/or secondary electrons 116 emitted by the surface of the sample 110 in response to the incident primary beam 104.

In one embodiment, the electron beam source 102 is configured for generating one or more primary electron beams 104. The electron beam source 102 may include any electron source known in the art. For example, the electron beam source 102 may include, but is not limited to, one or more electron guns. For instance, the electron beam source 102 may include a single electron gun for generating a single primary electron beam 104. In another instance, the electron beam source 102 may include multiple electron guns for generating multiple primary electron beams 104.

In another embodiment, the electron-optical column 105 may include a set of electron-optical elements. The set of electron-optical elements may direct at least a portion of the electron beam 104 onto a selected portion of the sample 110 (e.g., semiconductor wafer). The set of electron-optical elements of the electron-optical column 105 may include any electron-optical elements known in the art suitable for focusing and/or directing the electron beam 104 onto a selected portion of the sample 110. In one embodiment, the set of electron-optical elements includes one or more electron-optical lenses. For example, the electron-optical lenses may include, but are not limited to, one or more condenser lenses 106 for collecting electrons from the electron beam source 102. By way of another example, the electron-optical lenses may include, but are not limited to, one or more objective lenses 108 for focusing the electron beam 104 onto a selected region of the sample 110.

In another embodiment, the set of electron-optical elements of the electron-optical column 106 includes one or more electron beam scanning elements (not shown). For example, the one or more electron beam scanning elements may include, but are not limited to, one or more electromagnetic scanning coils or electrostatic deflectors suitable for controlling a position of the beam 104 relative to the surface of the sample 110. In this regard, the one or more scanning elements may be utilized to scan the electron beam 104 across the sample 110 in a selected pattern.

For purposes of simplicity a single electron-optical column 106 is depicted in FIG. 1A. It is noted herein that this configuration should not be interpreted as a limitation for the present disclosure. For example, the system 100 may include multiple electron-optical columns 106.

In another embodiment, the splitter element 112 is arranged so as to deflect secondary electrons and/or backscattered electrons emitted by the surface of the sample 110 to the entrance of the emittance analyzer assembly 120. For example, the splitter element 112 may include an electron velocity selector, such as, but not limited to, a Wien filter. In another embodiment, the system 100 may include a Wehnelt cylinder.

Figure 1B:
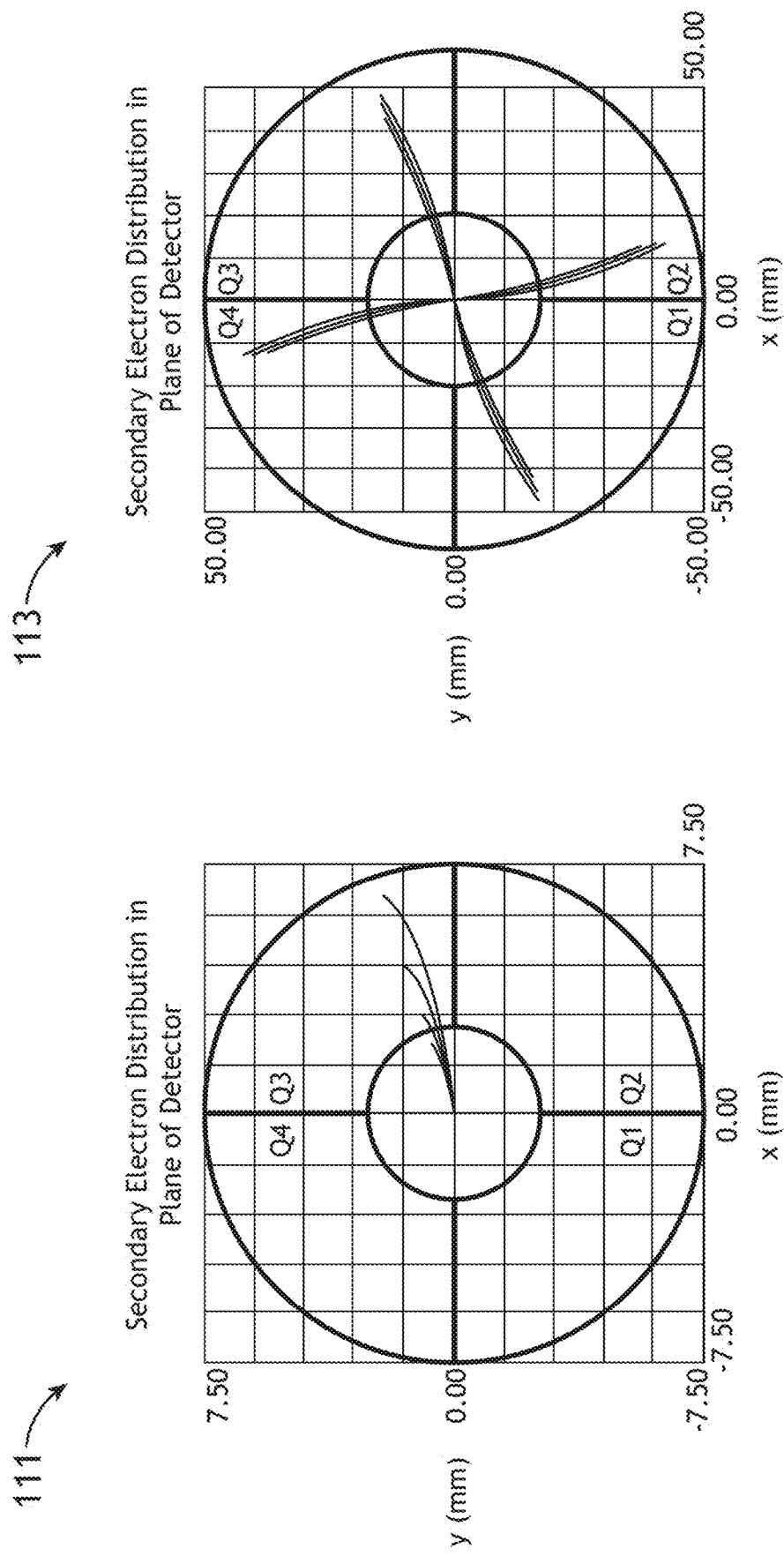

FIG. 1B illustrates the secondary electron distribution 111 for conventional behind-the-lens darkfield imaging and the secondary electron distribution 113 for imaging using the emittance analyzer for the present disclosure. Graphs 111 and 113 represent the secondary electron distributions in the plane of the detector of simulations at 1 eV, 2 eV, 5 eV and 10 eV. As shown in graph 111, polar angle alignment across the secondary electron energy range is poor. In contrast, as shown in graph 113, polar angle alignment across the secondary electron energy range is improved in the case of the emittance analyzer approach of the present disclosure.

Figure 1C:
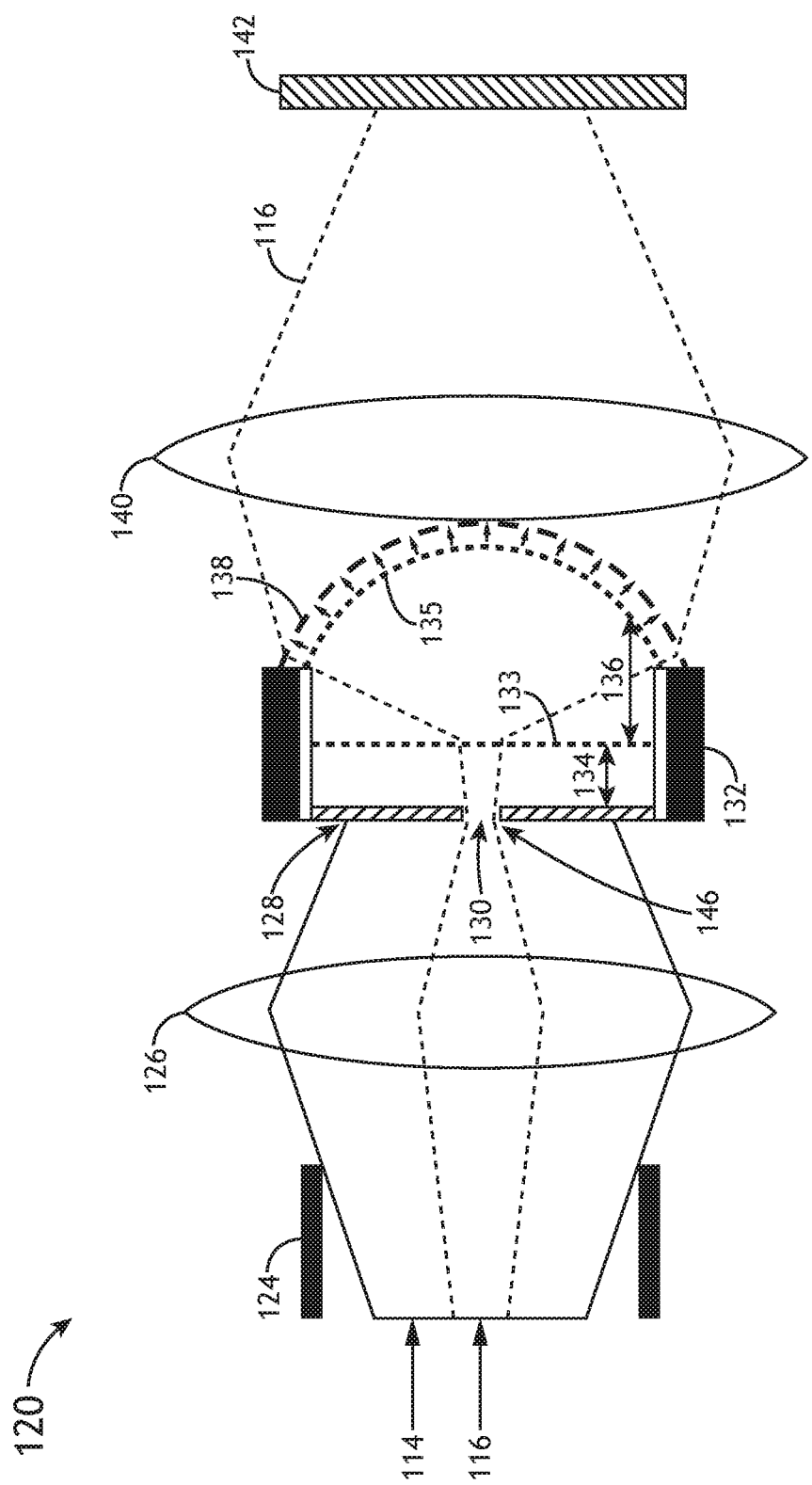

FIG. 1C illustrates a block diagram view of an emittance analyzer assembly 120 configured in SE-BSE imaging mode, in accordance with one embodiment of the present disclosure.

The system 100 operates by rapidly moving the secondary electrons 116 from the sample 110 to the entrance of the emittance analyzer 120. For example, this may be performed by accelerating them, with a large electric field, as they are emitted from the sample 110 and, then, employ a lens to form a conjugate point at the entrance of the analyzing portion of the assembly 120, decelerate the secondary electrons 116 back to their initial kinetic energy (the drift-region entrance), and then design analysis optics as if the secondary electrons 116 are being emitted from the conjugate point at the entrance to the drift-region. It is noted that a high "extraction field" is required not only to minimize transit time errors in polar discrimination but also to prevent large azimuth discrimination errors being introduced by the high magnetic field of the objective lens.

In one embodiment, the emittance analyzer assembly 120 includes a set of deflection optics 124. In one embodiment, the set of deflection optics are positioned prior to, or upstream of, one or more additional components of the emittance analyzer assembly 120. The set of deflection optics are configured to align the image beam including backscattered electrons 114 and/or secondary electrons 116 with one or more components of the emittance analyzer assembly 120. For example, the deflection optics 124 may serve to de-scan the image beam and align the image beam 114, 116 to be coaxial with respect to one or more of the additional components of the emittance analyzer assembly 120. It is further noted that the lateral velocity components imparted to the backscattered electrons 114 and/or the secondary electrons 116 from the primary beam scan elements may be cancelled with the set of deflection optics 124.

The set of deflection optics may include one or more sets of deflection elements. For example, the set of deflection optics 124 may include, but is not limited to, one or more quadrupole elements, one or more octupole elements or one or more higher-order electron-optical deflection elements. In one embodiment, the set of deflection optics 124 include one or more electrostatic deflectors. In another embodiment, the set of deflection optics 124 include one or more magnetic deflectors. For example, the one or more electrostatic or magnetic deflectors may be disposed within a high potential acceleration liner and floated at the liner potential.

In another embodiment, the emittance analyzer assembly 120 includes a first electron-optic lens 126 (or lenses). In one embodiment, the first electron-optic lens 126 is disposed downstream from the set of deflection optics 124. For example, the first electron-optic lens 126 may be disposed proximate to the set of deflection optics 124. In one instance, the first electron-optic lens 126 may serve to terminate the output of a high potential liner containing the set of deflection optics 124.

In one embodiment, the first electron-optic lens 126 includes an electrostatic lens. For example, the first electron-optic lens 126 may include, but is not limited to, an electrostatic lens configured for accelerating the backscattered electrons 114 and/or the secondary electrons 116 of the image beam. By way of another example, the first electron-optic lens 126 may include, but is not limited to, an electrostatic lens configured for decelerating the backscattered electrons 114 and/or the secondary electrons 116 of the image beam. In another embodiment, the first electron-optic lens 126 includes a magnetic lens.

In one embodiment, the emittance analyzer assembly 120 includes a first electron detector 128 including a center aperture 130. It is noted that throughout the present disclosure the center aperture 130 may be referred to as the entrance of the analyzing portion of the emittance analyzer assembly 120. In the case of SE-BSE imaging, the first electron detector 128 is configured for measuring backscattered electrons 114.

For example, the first electron-optic lens 126 is used to form a secondary electron conjugate point 130 with a demagnification greater than 1 in the plane of the first detector 128. The majority of the backscattered electrons 114 are collected by the detector 128 (e.g., segmented detector) allowing both bright-field and dark-field backscattered electron imaging. The secondary electrons 116 and the most axial backscattered electrons 114 pass through the first detector 128 aperture minimizing BSE contamination of the SE beam.

The first electron detector 128 may include any electron detector known in the art. For example, the first electron detector 128 may include, but is not limited to, a solid state detector. By way of another example, the first electron detector 128 may include, but is not limited to, a multi-channel plate. By way of another example, the first electron detector 128 may include, but is not limited to, a scintillator-type electron detector. In one embodiment, the first electron detector 128 is segmented into two or more segments (e.g., segmented detector shown in FIG. 1D). In one embodiment, the segments of the detector 128 are offset from the center aperture in the detector by the distance between the backscattered electron 114 beam center and the secondary electron 116 beam center in the plane of the detector 128. In another embodiment, the first electron detector 128 includes a magnetic shielding element (e.g., layer of magnetic material) disposed behind the detection portion of the first electron detector 128.

In one embodiment, the emittance analyzer assembly 120 forms a deceleration region 134 and a drift region 136. In one embodiment, the emittance analyzer assembly 120 includes one or more first mesh elements 133 disposed downstream from the first detector 128. In one embodiment, the first mesh element 133 includes a planar mesh. The first electron detector 128 may be held at ground potential with the first ground mesh element 133 held at (or near) the same potential as the surface of the sample 110 (e.g., virtual ground). In this manner, the electron deceleration region 133 is formed between the detector 128 and the first mesh element 133. After passing through the detector aperture, the secondary electrons 116 and axial backscattered electrons 114 are rapidly decelerated to the sample potential. It is noted that the distance between the detector 128 and the entrance of the drift region 136 (defined by position of the first mesh element 133) may be selected so as control (e.g., minimize) the deceleration time of secondary electrons 116, which aids in minimizing errors introduced during that time, while also preventing most backscattered electrons 114 from entering the drift region 136 of the emittance analyzer assembly 120.

In another embodiment, the emittance analyzer assembly 120 may include a separating tube 132 with electrical surface resistance between the entrance and the exit of the deceleration region 133 to form a linear, decelerating voltage gradient. Such a configuration helps insure that the equi-potentials between the entrance and exit of the decelerating region 133 are planar and uniform.

In another embodiment, the emittance analyzer assembly 120 includes one or more second mesh elements 135. In one embodiment, the second mesh element 135 includes a hemispherical wire mesh. The second mesh element 135 may also be held at (or near) the same potential as the surface of the sample 110. In this regard, the first mesh element 133 and the second mesh element 135 are held at the same potential, thereby forming the electron drift region 136. It is noted that the secondary electrons 116 and the backscattered electrons 114 enter the drift region 136 and follow the original momentum vectors with which they emerged from the sample 110. During this drift time, the polar angles of the secondary electrons 116 and the backscattered electrons 114 align. It is noted that a longer drift time for the secondary electrons 116 and backscattered electrons 114 leads to smaller residual polar angle alignment errors.

In another embodiment, the emittance analyzer assembly 120 includes an energy filter 138. In one embodiment, the energy filter 138 includes a hemispherical mesh centered on a conjugate point in the secondary electron 116 beam path to ensure the retarding field equi-potentials from the energy filter are arranged perpendicular to the trajectories of the secondary electrons 116 regardless of polar angle. It is noted that the threshold of the energy filter 138 may be changed with little to no effect on the polar angles of electrons 114, 116. The secondary electrons 116 and the axial backscattered electrons 114 may emerge from the second mesh element 135 (e.g., concave mesh) of the drift region 136 perpendicular to the mesh surface. After the secondary electrons 116 and the axial backscattered electrons 114 emerge from the secondary mesh element 135, which terminates the drift region 136, they begin decelerating as they travel toward the energy filter 138 (e.g., energy filter mesh). The perpendicular interception of the secondary electrons 116 and the axial backscattered electrons 114 by the energy filter 138 helps ensure that the assembly 120 discriminates against the total energy of the electrons 114, 116 and not just a component of total energy of the electrons 114, 116.

In some embodiments, the first mesh element 133, the second mesh element 135 and/or the mesh of the energy filter 138 may be formed from a magnetic material. It is noted that the use of a magnetic mesh for the first mesh element 133, the second mesh element 135 and/or the energy filter 138 serves to shield the deceleration region 134 and/or the drift region 136 from stray magnetic fields. In another embodiment, the emittance analyzer assembly 120 may include axially symmetric magnetic shielding that surrounds the deceleration region 134 and/or the drift region 136 also to shield the deceleration region 134 and/or the drift region 136 from stray magnetic fields.

In another embodiment, the emittance analyzer assembly 120 includes a deceleration tube 132, which contains or is connected to the one or more first mesh elements 133 and/or the one or more second mesh elements 135.

In another embodiment, the emittance analyzer assembly 120 includes a second electron-optic lens 140 (or lenses). In one embodiment, the second electron-optic lens 140 is disposed downstream from the energy filter 138. In one embodiment, the second electron-optic lens 140 may serve to terminate the drift region 136 or the energy filter 138. In one embodiment, a portion of the energy filter 138, the termination of the drift region 136 (e.g., second mesh element 135), or a second electron detector 142 (discussed below) may form a portion of the second electron-optic lens 140.

In one embodiment, the second electron-optic lens 140 includes an electrostatic lens. For example, the second electron-optic lens 140 may include, but is not limited to, an electrostatic lens configured for accelerating the backscattered electrons 114 and/or the secondary electrons 116 of the image beam. By way of another example, the second electron-optic lens 140 may include, but is not limited to, an electrostatic lens configured for decelerating the backscattered electrons 114 and/or the secondary electrons 116 of the image beam. In another embodiment, the second electron-optic lens 140 includes a magnetic lens.

In another embodiment, the emittance analyzer assembly 120 includes a second electron detector. In this embodiment, the second electron detector 142 is configured to collect the secondary electrons 116 and/or axial backscattered electrons 114. For example, as the backscattered electrons 114 and/or the secondary electrons 116 emerge from the energy filter 138 they accelerate through the second electron-optic lens 140, which serves to de-magnify the image beam in the plane of the second electron detector 142.

The second electron detector 142 may include any electron detector known in the art. For example, the second electron detector 142 may include, but is not limited to, a solid state detector. By way of another example, the second electron detector 142 may include, but is not limited to, a multi-channel plate. By way of another example, the second electron detector 142 may include, but is not limited to, a scintillator-type electron detector. In one embodiment, the second electron detector 142 is segmented into two or more segments (e.g., segmented detector shown in FIG. 1D). In another embodiment, the second electron detector 142 includes a magnetic shielding element (e.g., layer of magnetic material) disposed behind the detection portion of the second electron detector 142.

FIG. 1D illustrates a schematic view of a segmented electron detector suitable for use as the first electron detector 128, in accordance with one or more embodiments of the present disclosure. As shown in FIG. 1D, the segmented electron detector 128 (e.g., segmented solid state detector) includes four quadrant detecting portions Q1, Q2, Q3 and Q4. In addition, the segmented electron detector 128 includes a central detection portion C. Further, an aperture 146 passes through the center of the central detection portion C. The aperture 146 allows for the transmission of secondary electrons 116 through the detector 128, while high angle backscattered electrons 114 are collected by the quadrant detecting portions Q1, Q2, Q3 and Q4.

FIG. 1E illustrates a schematic view of a high density array electron detector suitable for use as the first electron detector 128, in accordance with one or more embodiments of the present disclosure. As shown in FIG. 1E, the high density array electron detector includes a high density array 144 for collecting and resolving the position of electrons. The high density array detector 128 includes the aperture 146, which again allows for the transmission of secondary electrons 116 through the detector 128, while high angle backscattered electrons 114 are collected by the array 144.

It is noted that the detector configurations depicted in FIGS. 1D-1E may also be implemented in the case of detector 142, although an aperture 146 would be unnecessary for the detector 142. In the case where the detector 142 is a segmented detector (e.g., segmented solid state detector) or is a high density array detector, bright-field and/or dark-field images may be formed by the assembly 120.

FIG. 1F illustrates an emittance analyzer 150, in accordance with an alternative embodiment of the present disclosure. In this embodiment, the emittance analyzer 150 eliminates the first detector, thereby sacrificing simultaneous detection of backscattered electrons. In another embodiment, the emittance analyzer 150 includes an aperture plate 158. The aperture plate 158 serves to block backscattered electrons from reaching the detector 142. In this regard, the detector 142 will only detect secondary electrons or near paraxial backscattered electrons.

Figure 1G:
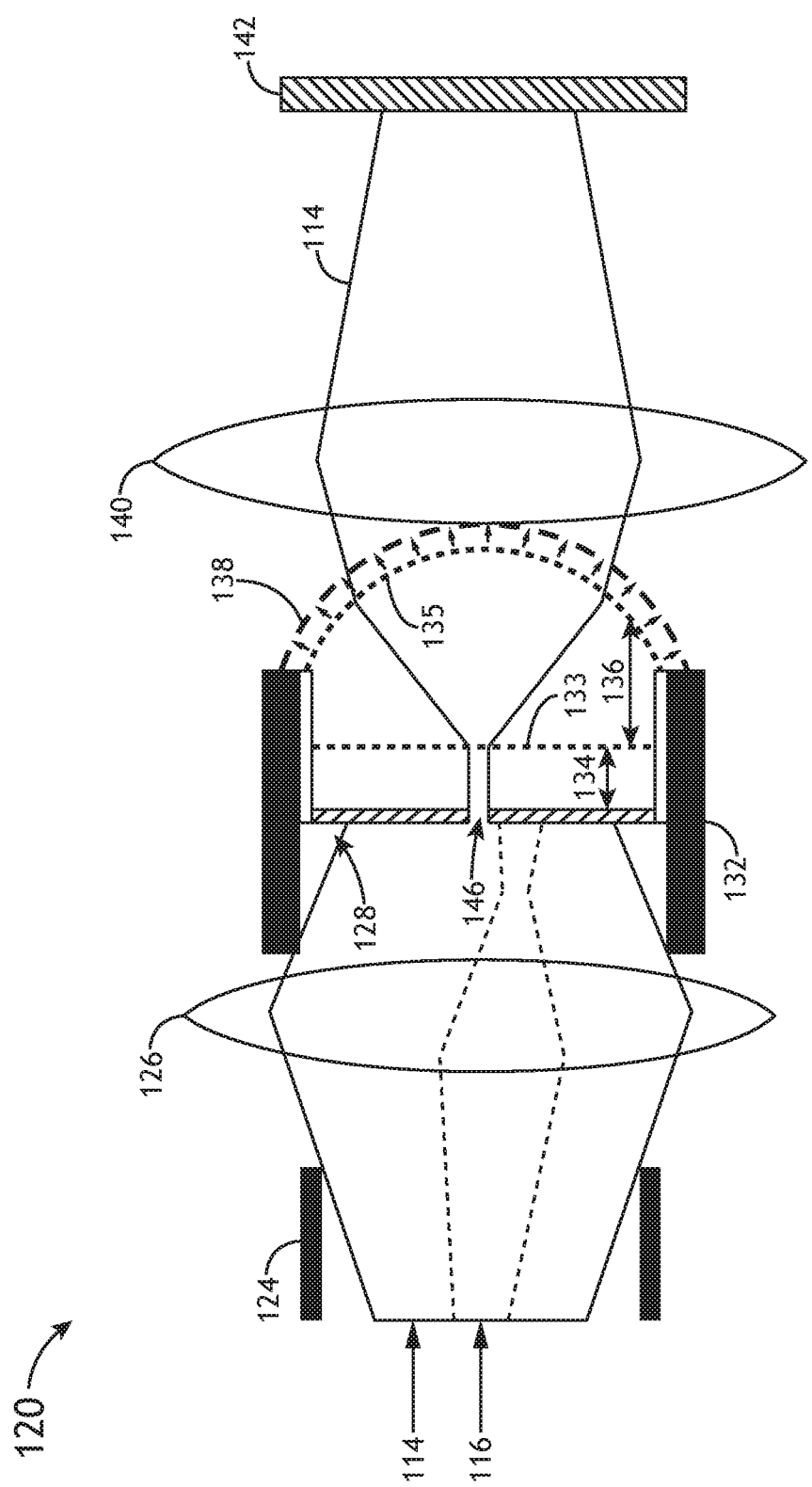

FIG. 1G illustrates the emittance analyzer assembly 120 configured in BSE-HAR imaging mode, in accordance with one embodiment of the present disclosure. As noted previously herein, the system 100 may be switched from the SE-BSE configuration of FIG. 1C to the BSE-HAR configuration of FIG. 1G. In some embodiments, one or more controllers 121 may be used to adjust the various components of the system 100 to transition from one configuration to a different configuration.

It is noted that the incident secondary electron beam 116 and backscattered electron beam 114 are not concentric as the splitter 112 (e.g., Wien filter) acts to deflect them through different angles. In one embodiment, the set of deflection elements 124 may center the backscattered electron cone 114 on the aperture of first detector 128. In this regard, only the most axial backscattered electrons pass through the aperture 146, as shown in FIG. 1G.

In one embodiment, the energy filter 128 is set to reject secondary electrons such that the second detector 142 produces simultaneous bright-field and dark-field images using only near paraxial backscattered electrons (passed through aperture 146) for high aspect ratio structure imaging. In this regard, the controller 121 (or another controller) may adjust the energy filter 128 so to reject the secondary electrons, thereby converting the emittance analyzer assembly 120 from the SE-BSE mode to the BSE-HAR mode.

In another embodiment, the energy filter 128 is set to pass only the highest energy backscattered electrons to the second electron detector 142, thereby enhancing resolution of the image(s) collected with the system 100. In another embodiment, the second electron-optic lens 140 is used to select the polar angle discrimination ratio of electrons.

In another embodiment, bright-field and/or dark-field images of larger polar angle backscattered electrons (i.e., the electrons not transmitted through aperture 146) may be obtained with the first electron detector 128. In this regard, the images of larger polar angle backscattered electrons may be obtained simultaneously with the images formed with near paraxial backscattered electrons using the second electron detector 142.

Figure 1H:
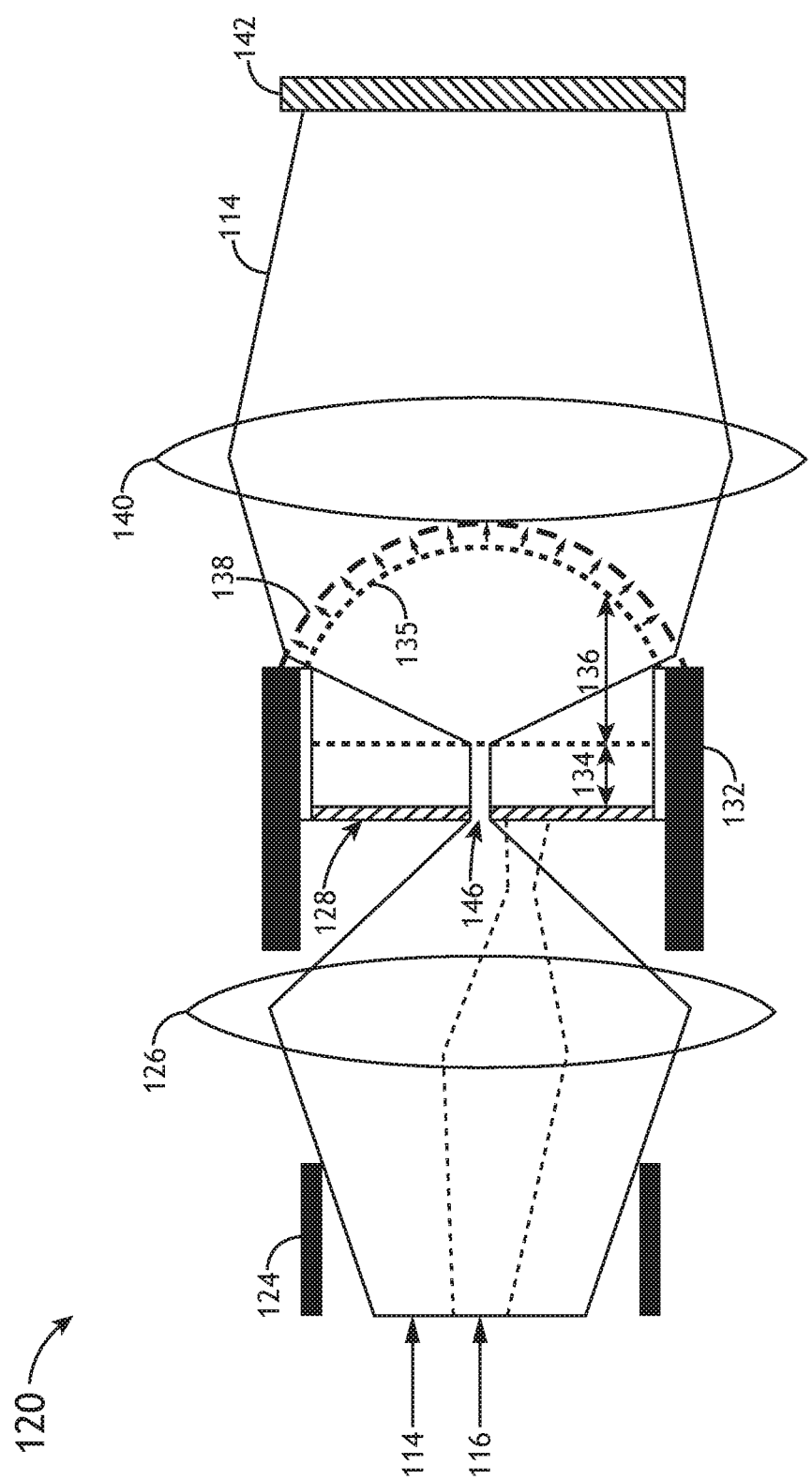

FIG. 1H illustrates the emittance analyzer assembly 120 configured in BSE-only mode, in accordance with one embodiment of the present disclosure. As noted previously herein, the system 100 may be switched from the BSE-HAR configuration of FIG. 1G to the BSE-only configuration of FIG. 1H.

In one embodiment, the set of deflection elements 124 may center the backscattered electron cone 114 onto the aperture 146 of the first electron detector 128. In another embodiment, the first electron-optic lens 126 is used to focus the backscattered electrons 114 to form a conjugate point in the backscattered electron beam path in the plane of the first detector 128. In this regard, all or a significant portion of the backscattered electrons 114 are passed through the first detector 128.

In another embodiment, the energy filter 128 is set (e.g., set by controller 121) to reject secondary electrons 116. As such, the second electron detector 142 may be used to produce simultaneous bright-field and dark-field backscattered electron images. In another embodiment, energy filter 128 is set (e.g., set by controller 121) to pass high energy backscattered electrons (i.e., backscattered electrons above a selected threshold) to the second electron detector 142 in order to enhance image resolution. In another embodiment, the second electron-optic lens 140 is used to select the polar angle discrimination ratio of electrons. The drift region 136 of the emittance analyzer assembly 120 may align the backscattered electron polar angles as efficiently as it aligns secondary electron polar angles. It is noted, however, that backscattered electrons have a larger initial polar angle error than the secondary electrons as result of transport from the sample 110 to the assembly 120.

In another embodiment, the first electron detector 128 is used to produce partial bright-field secondary electron images.

It is again noted that the emittance analyzer assembly 120 may be rapidly switched between SE-BSE, BSE-HAR and BSE-only modes, which are depicted in FIGS. 1C, 1G and 1H. In some embodiments, one or more controllers 121 may be used to adjust the various components of the system 100 to transition between the SE-BSE, BSE-HAR and BSE-only modes. In this regard, set points for the each of the modes may be pre-calibrated and stored in memory (e.g., memory of the controller 121). Further, the set points may be recalled by the controller 121, which then uses the set points to establish the preferred mode.

Figure 2:
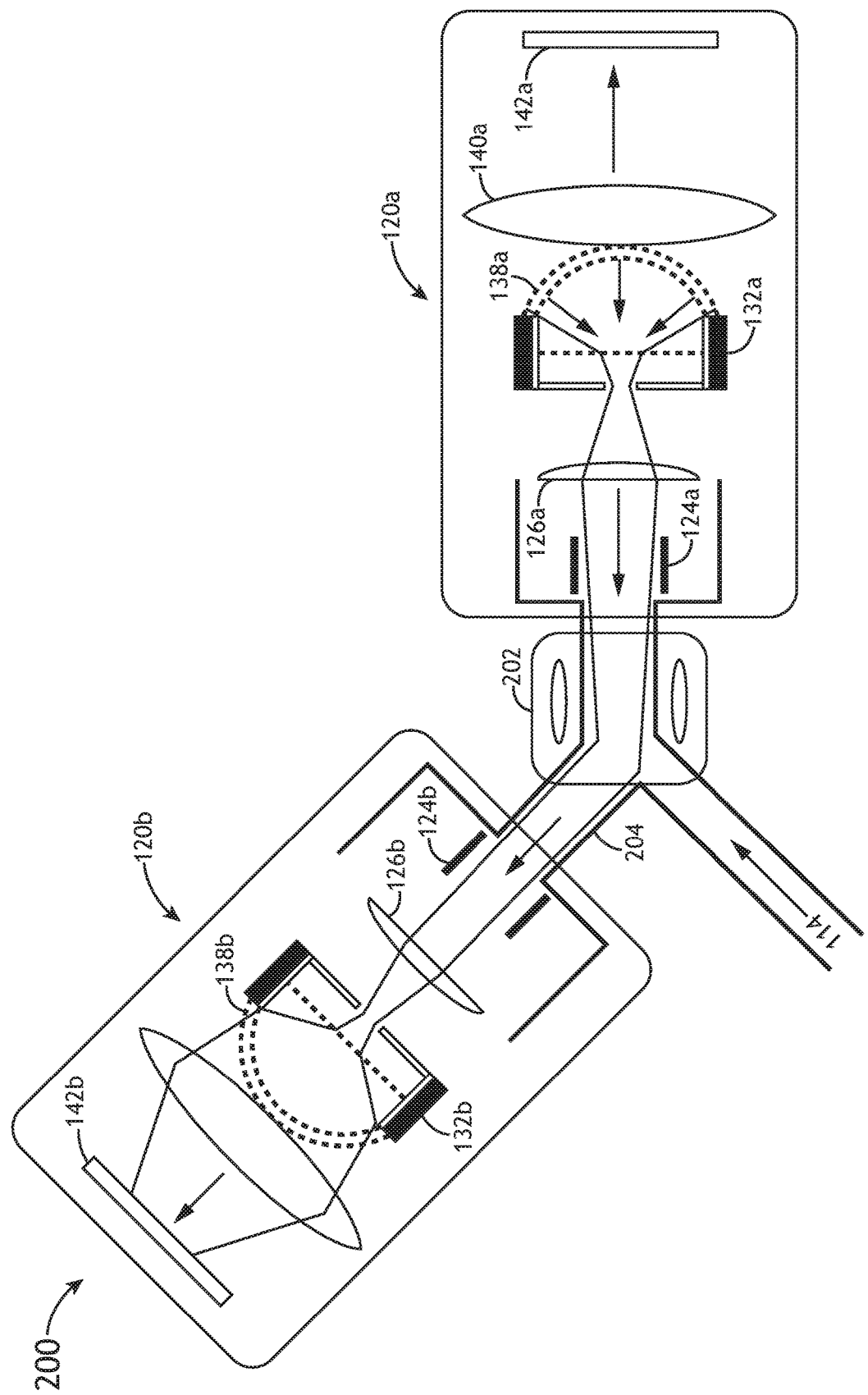

FIG. 2 illustrates a block diagram view of a system 200 that implements two emittance analyzer assemblies 120a, 120b to form a bandpass energy filter with simultaneous acquisition of highpass and bandpass images, in accordance with one or more embodiments of the present disclosure. In one embodiment, the system 200 includes a first emittance analyzer 120a and a second emittance analyzer 120b. In another embodiment, the system 200 includes a splitter element 202 (e.g., Wien filter).

It is noted herein that the system 200 may be implemented to analyze secondary electrons and/or backscattered electrons. While the following description focuses on the implementation of system 200 in the context of secondary electrons, this is not a limitation on the present disclosure. It is noted that system 200 and the embodiments and components described below may be extended to a backscattered electron context.

In one embodiment, the emittance analyzer assembly 120a deflection is used to remove lateral momentum vectors imparted on the image beam by the illumination scanning optics. In another embodiment, the deflection optics 124a of the first emittance analyzer assembly 120a is used to center the secondary electron cone to be paraxial with the optical image path. In another embodiment, the first electron-optics lens 126a of the first emittance analyzer assembly 120a forms a point conjugate to the secondary electron emission point on the sample (not shown) in the secondary electron beam path in the plane of the detector 128a at the entrance to the deceleration region to block backscattered electrons and coincide with an aperture opening in the plate large enough to let secondary electrons pass through.

In one embodiment, an acceleration tube 204 immerses the image path from the illumination/image beam splitter 202 to the entrance of the deceleration region in the first emittance analyzer assembly 120a in a positive high voltage. In another embodiment, the first electron-optics lens 126a of the first emittance analyzer assembly 120a de-magnifies the secondary electron beam 114.

In another embodiment, the second electron-optic lens 140a of the first emittance analyzer assembly 120a selects the secondary electron polar angle discrimination threshold for dark-filed secondary electron imaging.

In another embodiment, the energy filter 138a of the first emittance analyzer assembly 120a passes only high energy secondary electrons and rejects low energy secondary electrons.

In another embodiment, the splitter element 202 separates the incoming secondary electron image beam from the secondary electrons rejected by the first emittance analyzer assembly 120a.

In another embodiment, the beam splitter element 202 includes one or more sets of magnetic deflection coils. In another embodiment, the beam splitter is a Wien filter. In another embodiment, the accelerating liner tube 204 may extend along the image path between the first emittance analyzer assembly 120a and the second emittance analyzer assembly 120b.

In another embodiment, the second emittance analyzer assembly 120b may include an aperture plate at the entrance of the deceleration region of the second emittance analyzer assembly 120b. For example, the aperture plate may be a magnetic plate.

In another embodiment, the deflection optics 124b of the second emittance analyzer assembly 120b center the secondary electron beam cone on the second emittance analyzer assembly 120b aperture plate at the entrance of the deceleration region.

In another embodiment, the second electron-optic lens 126b of the second emittance analyzer assembly 120b forms a conjugate point in the plane of the detector 128b and centered on the aperture plate at the entrance of the deceleration region.

In another embodiment, the energy filter 138b of the second emittance analyzer assembly 120b acts to pass only the highest energy secondary electrons rejected from the first emittance analyzer assembly 120*a*.

In another embodiment, the second electron-optic lens 126*b* of the second emittance analyzer assembly 120*b* sets the secondary electron polar angle discrimination threshold.

In another embodiment, the system 200 simultaneously produces the following: secondary high-pass, brightfield and darkfield images using secondary electrons with energies greater than the energy filter setting of the first emittance analyzer assembly 120*a*; bandpass, brightfield and darkfield secondary electron images using energies between the energy filter setting of the first emittance analyzer assembly 120*a* and the energy filter setting of the second emittance analyzer assembly 120*b*; and brightfield and darkfield backscattered electron images.

Figure 3:
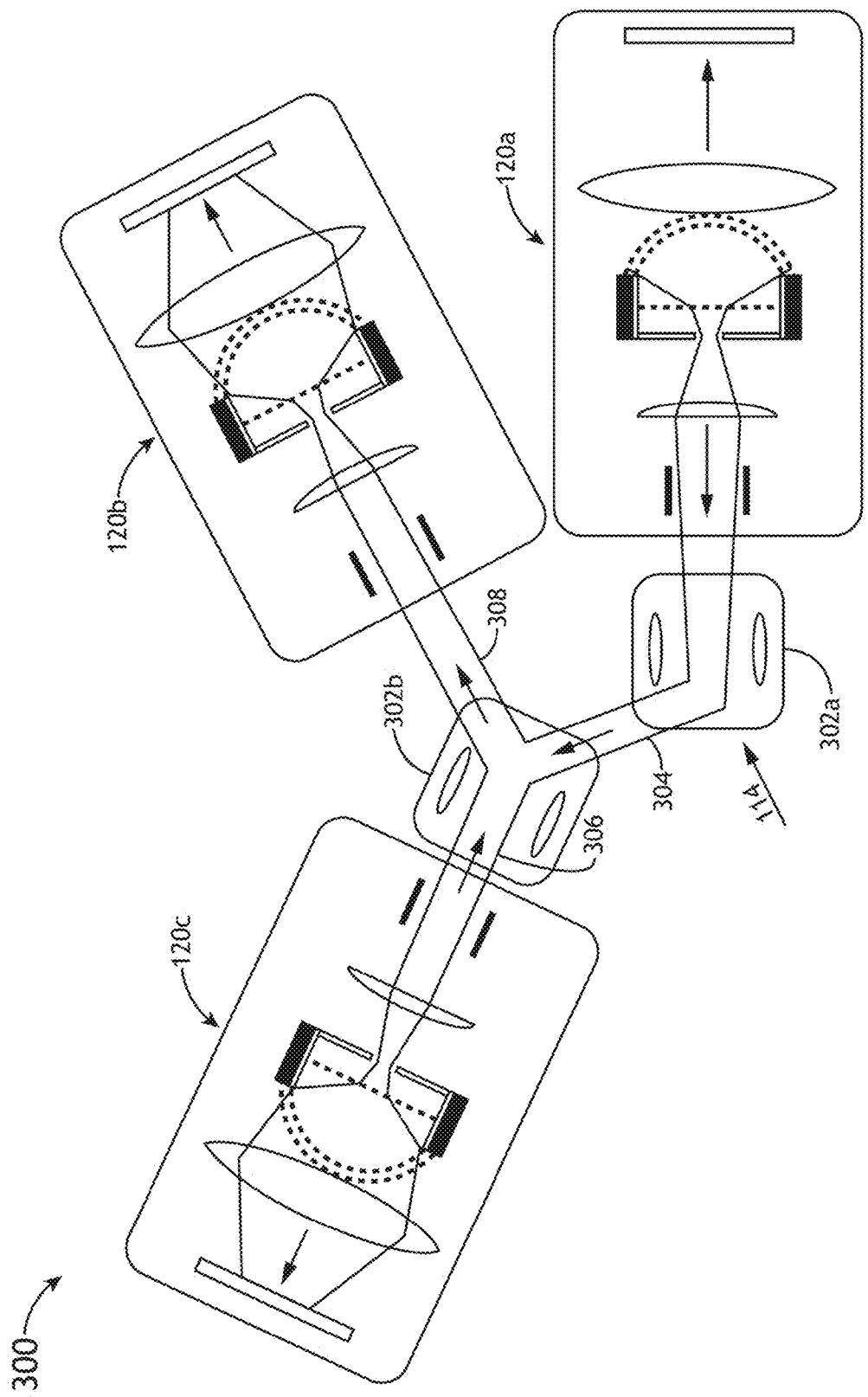

FIG. 3 illustrates a block diagram view of a system 300 that implements three emittance analyzer assemblies 120*a*, 120*b*, and 120*c* to capture the full electron energy spectrum in low-pass, bandpass and high-pass bands, in accordance with one or more embodiments of the present disclosure.

It is noted herein that the system 300 may be implemented to analyze secondary electrons and/or backscattered electrons. While the following description focuses on the implementation of system 300 in the context of secondary electrons, this is not a limitation on the present disclosure. It is noted that system 300 and the embodiments and components described below may be extended to a backscattered electron context.

In one embodiment, the system 300 includes a first emittance analyzer assembly 120*a*, a second emittance analyzer assembly 120*b* and a third emittance analyzer assembly 120*c*. In another embodiment, the system 300 includes a first splitter element 302*a* and a second splitter element 302*b*. In another embodiment, the system 300 includes a three-armed 304, 306, 308 accelerating liner.

In one embodiment, the emittance analyzer assembly 120*a* deflection is used to remove lateral momentum vectors imparted on the image beam by the illumination scanning optics. In another embodiment, the deflection of the first emittance analyzer assembly 120*a* is used to center the secondary electron cone to be paraxial with the optical image path. In another embodiment, the first electron-optics lens 126*a* of the first emittance analyzer assembly 120*a* forms a point conjugate to the secondary electron emission point on the sample (not shown) in the secondary electron beam path in the plane of the detector 128 at the entrance to the deceleration region to block backscattered electrons and coincide with an aperture opening in the plate large enough to let secondary electrons pass through.

In one embodiment, an acceleration tube 204 immerses the image path from the illumination/image beam splitter 202 to the entrance of the deceleration region in the first emittance analyzer assembly 120*a* in a positive high voltage. In another embodiment, the first electron-optics lens 126*a* of the first emittance analyzer assembly 120*a* de-magnifies the secondary electron beam 114.

In another embodiment, the second electron-optic lens 140*a* of the first emittance analyzer assembly 120*a* selects the secondary electron polar angle discrimination threshold for dark-filed secondary electron imaging.

In another embodiment, the energy filter 138*a* of the first emittance analyzer assembly 120*a* passes only high energy secondary electrons and rejects low energy secondary electrons.

In another embodiment, the splitter element 202 separates the incoming secondary electron image beam from the secondary electrons rejected by the first emittance analyzer assembly 120*a*.

In another embodiment, the beam splitter element 202 includes one or more sets of magnetic deflection coils. In another embodiment, the beam splitter is a Wien filter. In another embodiment, the accelerating liner tube 204 may extend along the image path between the first emittance analyzer assembly 120*a* and the second emittance analyzer assembly 120*b*.

In another embodiment, the second emittance analyzer assembly 120*b* may include an aperture plate at the entrance of the deceleration region of the second emittance analyzer assembly 120*b*. For example, the aperture plate may be a magnetic plate.

In another embodiment, the deflection optics 124*b* of the second emittance analyzer assembly 120*b* center the secondary electron beam cone on the second emittance analyzer assembly 120*b* aperture plate at the entrance of the deceleration region.

In another embodiment, the second electron-optic lens 126*b* of the second emittance analyzer assembly 120*b* forms a conjugate point in the plane of and centered on the aperture plate at the entrance of the deceleration region.

In another embodiment, the energy filter of the second emittance analyzer 120*b* passes only the highest energy secondary electrons rejected from the first emittance analyzer 120*a* and renders simultaneous brightfield and darkfield images with secondary electrons whose energies lie between the first emittance analyzer 120*a* energy filter setting and the second emittance analyzer 120*b* energy filter setting.

In another embodiment, the second electron-optic lens of the second emittance analyzer 120*b* sets the secondary electron polar angle discrimination threshold. In another embodiment, the accelerating liner tube 304, 308 is used along the image path between first emittance analyzer 120*a* and second emittance analyzer 120*b*.

In another embodiment, the splitter element 302*b* separates the secondary electrons entering the second emittance analyzer 120*b* from the secondary electrons rejected by the second emittance analyzer 120*b*.

In another embodiment, the accelerating liner tube 306, 308 is along the image path between the second emittance analyzer 120*b* and third emittance analyzer 120*c*.

In another embodiment, the system 300 includes an aperture plate (e.g., magnetic) at the entrance of the deceleration region of the third emittance analyzer 120*c*.

In another embodiment, the deflection optics of the third emittance analyzer 120*c* serve to center the secondary electron beam cone on the third emittance analyzer 120*c* aperture plate at the entrance of the deceleration region.

In another embodiment, the first electron-optic lens of the third emittance analyzer 120*c* forms a conjugate point in the plane of and centered on the aperture plate at the entrance of the deceleration region.

In another embodiment, the energy filter of the third emittance analyzer 120*c* passes all secondary electrons rejected from the second emittance analyzer 120*b* and renders simultaneous brightfield and darkfield images with secondary electrons whose energies lie between the energy filter setting of the first emittance analyzer 120*a* and the energy filter setting of the second emittance analyzer 120*b*.

In another embodiment, the second electron-optic lens of the third emittance analyzer 120*c* sets the secondary electron polar angle discrimination threshold.

In another embodiment, the system 300 simultaneously produces the following: secondary electron high-pass, brightfield and darkfield images using secondary electrons with energies greater than the energy filter setting of the first emittance analyzer 120*a*; bandpass, brightfield and darkfield secondary electron images using energies between the energy filter setting of the first emittance analyzer 120*a* and the filter setting of the second emittance analyzer 120*b*; brightfield and darkfield images using secondary electrons with energies lower than the energy filter setting of the second emittance analyzer 120*b*; and brightfield and darkfield backscattered electron images.

FIGS. 4A-4H illustrate effects of wafer surface charging and beam drift during image acquisition, in accordance with one or more embodiments of the present disclosure.

It is noted that in order to operate the emittance analyzer assembly 120 of the present disclosure at full performance entitlement, the image beam position and image beam cone semi-angle must be unaffected by local charge fields and other external influences. The image beam focal plane from the first electron-optic lens 124 should remain stable in the presence of a charging sample 110 and the image beam position in the plane of its crossover should be stable and coaxial with the emittance analyzer assembly 120. It is noted that a combination of high extraction field, in-situ-flood, and detector output feedback may be used to stabilize the image-beam position and cone angle drift caused by sample charging.

Figure 4A:
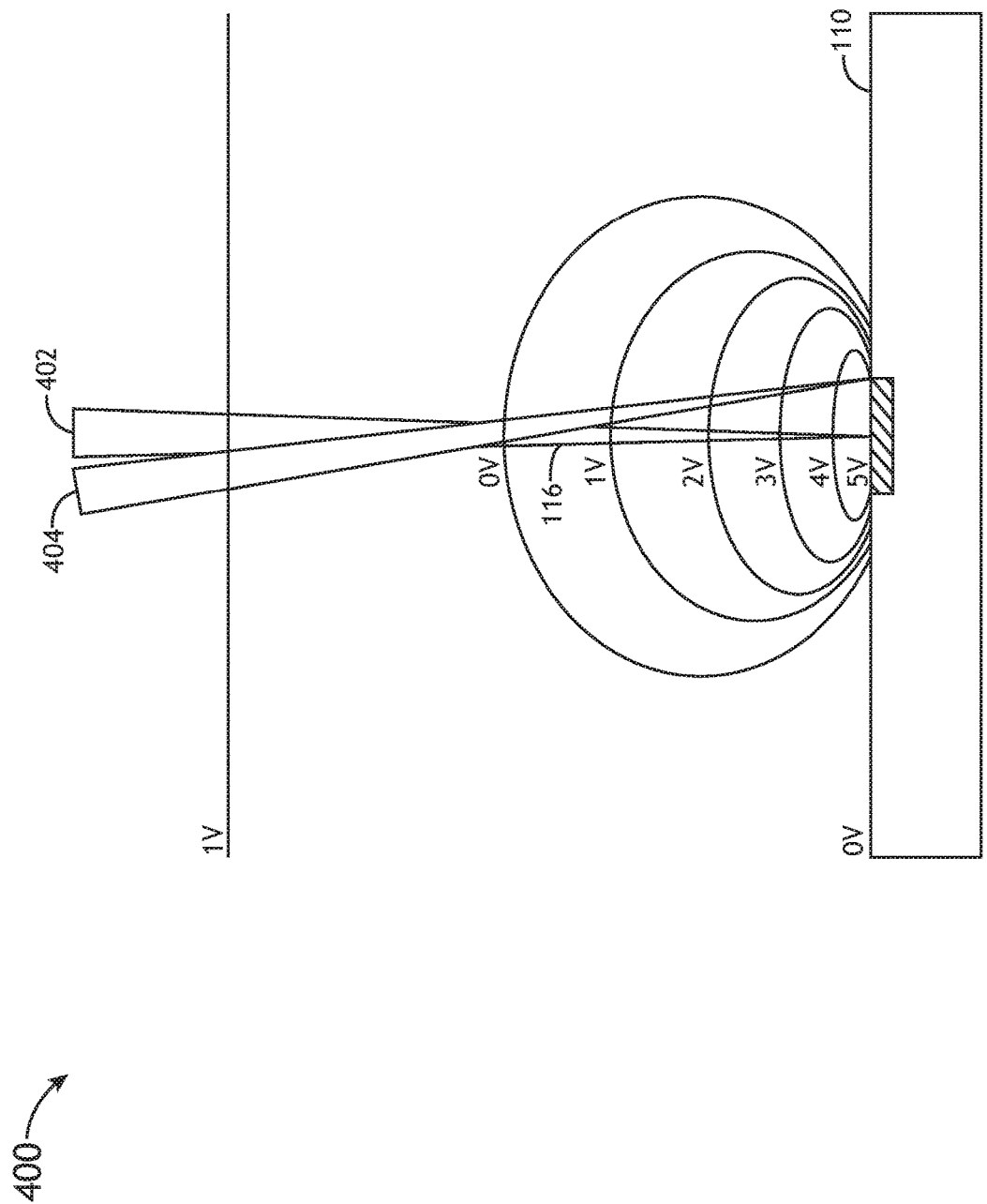

FIG. 4A illustrates a conceptual view 400 of sample surface charging caused by a primary beam during image acquisition in a low extraction field environment, in accordance with one or more embodiments of the present disclosure. As charge builds up on the sample 110 (e.g., wafer), the secondary electrons experience strong lateral fields reaching megavolts per meter at the edge of the field of view (FOV) causing the secondary electron cone 116 to be deflected from zero degrees (402) with respect to the optical axis to a non-zero degree (404) alignment. The deflection is unsymmetrical across the secondary electron energy spectrum, with the slower secondary electrons experiencing a larger deflection because of their longer interaction time. In this example, the fields are symmetric and the secondary electrons in the middle of the FOV are undeflected. As a result, the secondary electron image-beam deflection angle changes with position in the FOV. In addition to the secondary electron beam instability, the local charge presents a potential barrier to the secondary electrons (e.g., 5V in the example of FIG. 4A). Therefore, in this example, all secondary electrons with less than 5 eV of energy fail to reach the emittance analyzer assembly 120 (not shown in FIG. 4A).

Figure 4B:
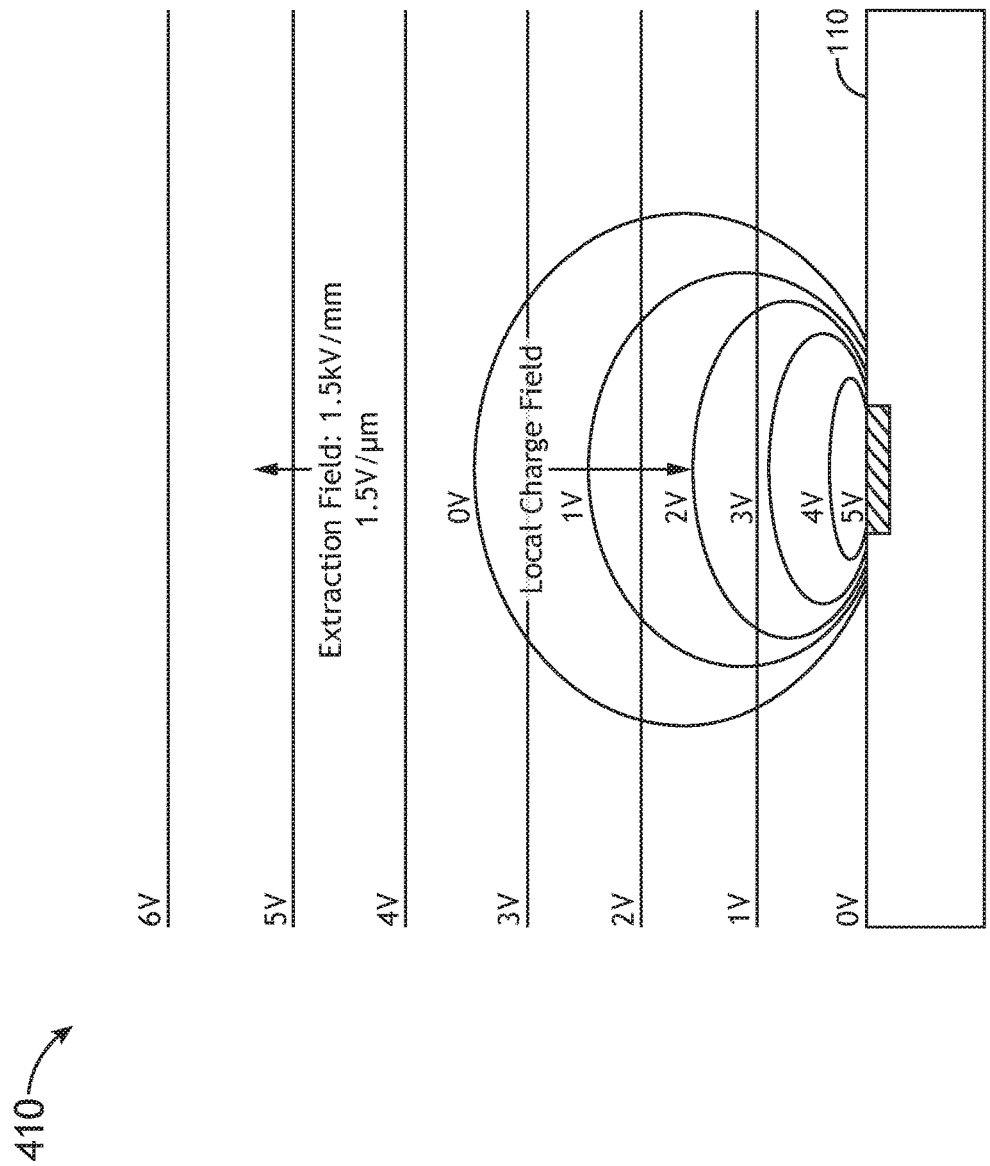
Figure 4C:
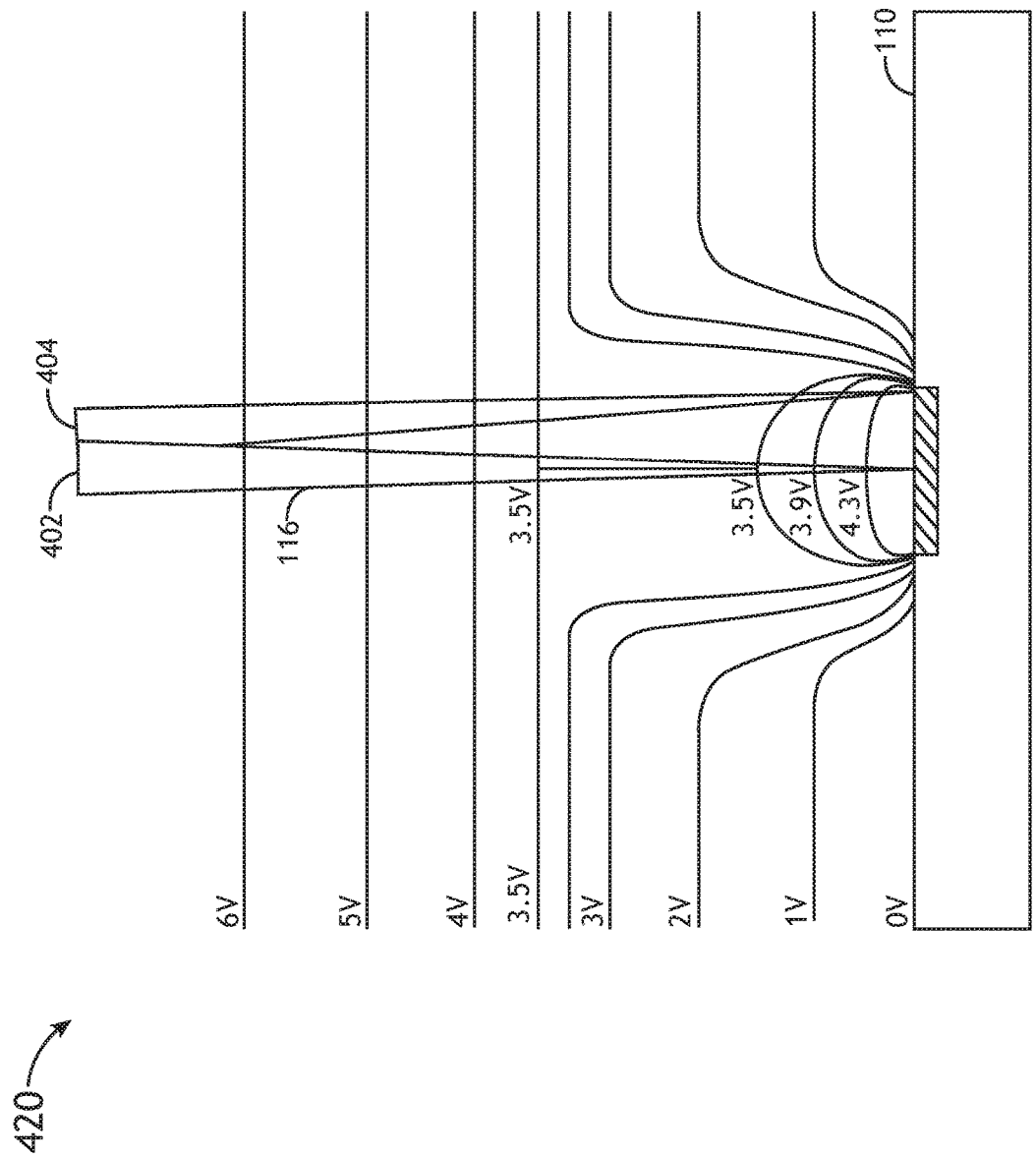
Figure 4D:
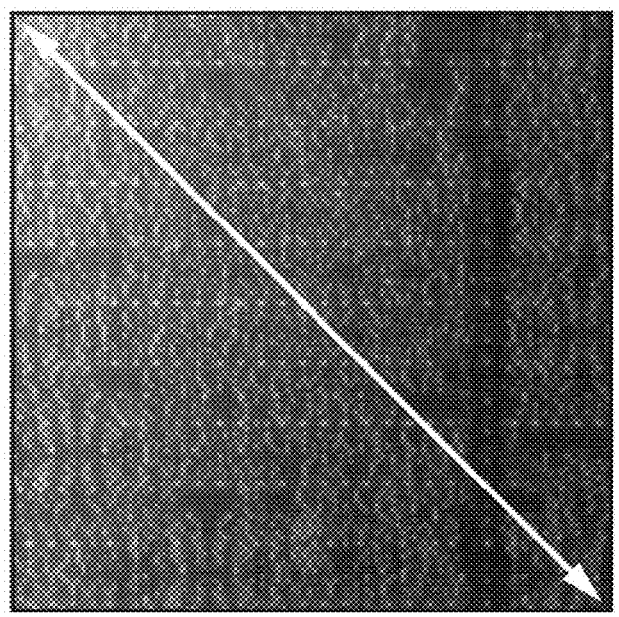

FIG. 4B illustrates a conceptual view 410 of the local charge field equi-potentials and large extraction field equi-potentials, in accordance with one or more embodiments of the present disclosure. FIG. 4C illustrates a conceptual view 420 of the superposition of the local charge field and the large extraction field, in accordance with one or more embodiments of the present disclosure. It is noted that the extraction field reduces the potential barrier presented to the secondary electrons by the charge field and greatly reduces the lateral field strength at the edge of the FOV. Therefore, the image beam 116 is not deflected as strongly at the edge of the FOV and more image signal reaches the detector(s) of the emittance analyzer assembly 120. FIG. 4D depicts an image 430 obtained from a sample 110 where secondary electron beam drift occurred during the image acquisition. As shown, the image 430 displays a significant amount of contrast variation, which varies diagonally across the image, resulting from image-beam drift during imaging.

It is noted that the utilization of in-situ flood pre-dosing can reduce the charge potential barrier and lateral fields caused by surface charging.

FIG. 4E illustrates a conceptual view 440 of the effect of a flood charge, in accordance with one or more embodiments of the present disclosure. For example, as shown, a 10 μm area in-situ flood charge is applied. Charge equi-potentials from an in-situ pre-dose surrounding a 1 μm image area and the equi-potential lines from a large extraction field (1.5 kV/μm) are depicted. The flood field used should saturate the insulating material to be imaged. In this way, the charge added by the primary beam 104 during imaging will not significantly change the surface potential of the sample 110.

Figure 4F:
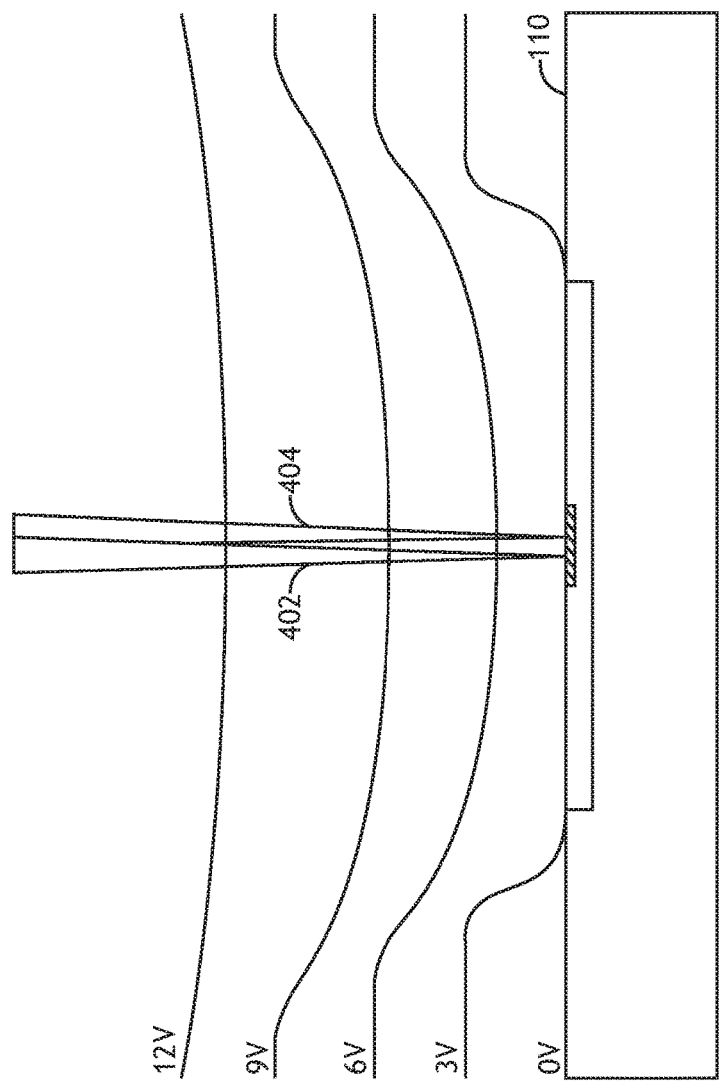

FIG. 4F illustrates a conceptual view 450 of the superposition of the in-situ flood charge field and the extraction view, in accordance with one or more embodiments of the present disclosure. In the above example, the potential barrier presented to the secondary electrons is reduced to <0.5V and the lateral fields are nearly eliminated at the edge of the image FOV. Therefore, a maximum image beam reaches the detector and the image beam position is more stable across the image FOV. By reducing the local field strength associated with local charging, lensing of the image beam by local charging is significantly reduced.

Figure 4G:
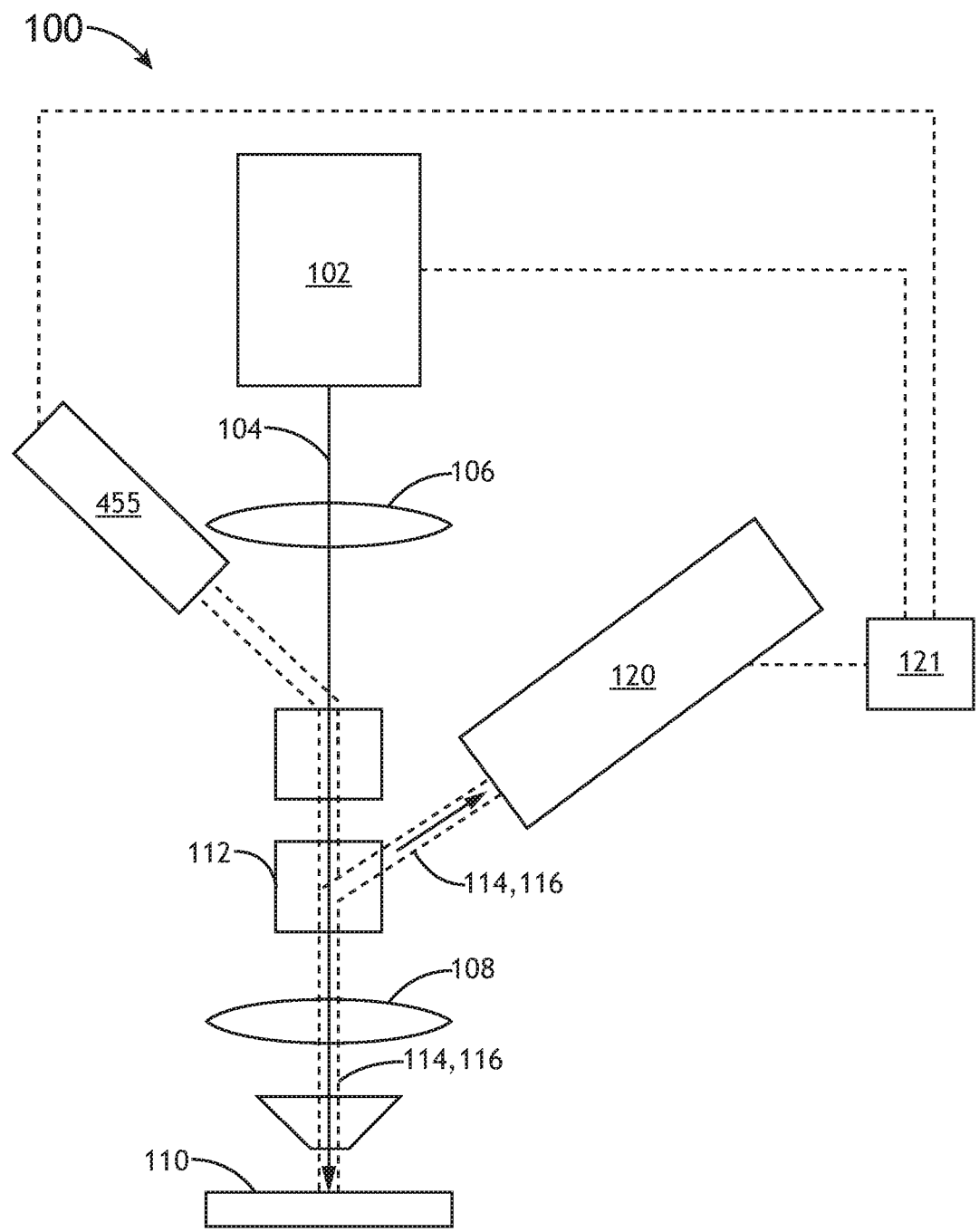

FIG. 4G illustrates a block diagram view of the system 100 equipped with in-situ flood capabilities, in accordance with one or more embodiments of the present disclosure. The use of an in-situ flood approach may be used in combination with the emittance analyzer assembly 120 of the present disclosure to help eliminate polar error discrimination errors caused by surface charging. Further, the performance of the emittance analyzer assembly 120 is enhanced due to the stabilization of the image beam achieved using an in-situ flood process.

In one embodiment, as shown in FIG. 4G, the system 100 may include a dedicated flood gun 455 configured to pre-dose the surface of the sample 110 with a selected amount of charge. In another embodiment, not shown in FIG. 4G, the system may pre-dose the surface of the sample 110 using the primary beam 104 from the electron source 102.

In one embodiment, the in-situ flood time is determined by detecting, with the emittance analyzer assembly 120, that the surface potential of the sample has charged to a predetermined value. In another embodiment, upon determining that the surface potential of the sample 110 has charged to a predetermined value, the system 100 may pre-dose the surface of the sample, with the primary beam 104 or a dedicated flood gun 455. For example, the controller 121 may receive surface potential measurements of sample 110 from the emittance analyzer assembly 120. Then, the controller 121 may determine whether the surface of the sample 110 has charged to a predetermined value or threshold. In turn, in the case where the surface of the sample 110 shows charging above the predetermined value, the controller 121 may direct the electron source 102 or the dedicated flood gun 455 to apply a pre-dose to the surface of the sample 110.

In another embodiment, the system 100 may pre-dose the sample 110 to a predetermined voltage via an in-situ-flood gun 455 immediately before image acquisition, then hold the emittance analyzer assembly 120 at that voltage during the beginning of image acquisition for a pre-determined time before asserting the control loop.

In another embodiment, an accelerating liner tube is placed coaxially along the image beam path 114, 116 to minimize transit time of the secondary electrons 116 to the emittance analyzer assembly 120 and to reduce axial displacement which is translated to polar angle errors.

Figure 4H:
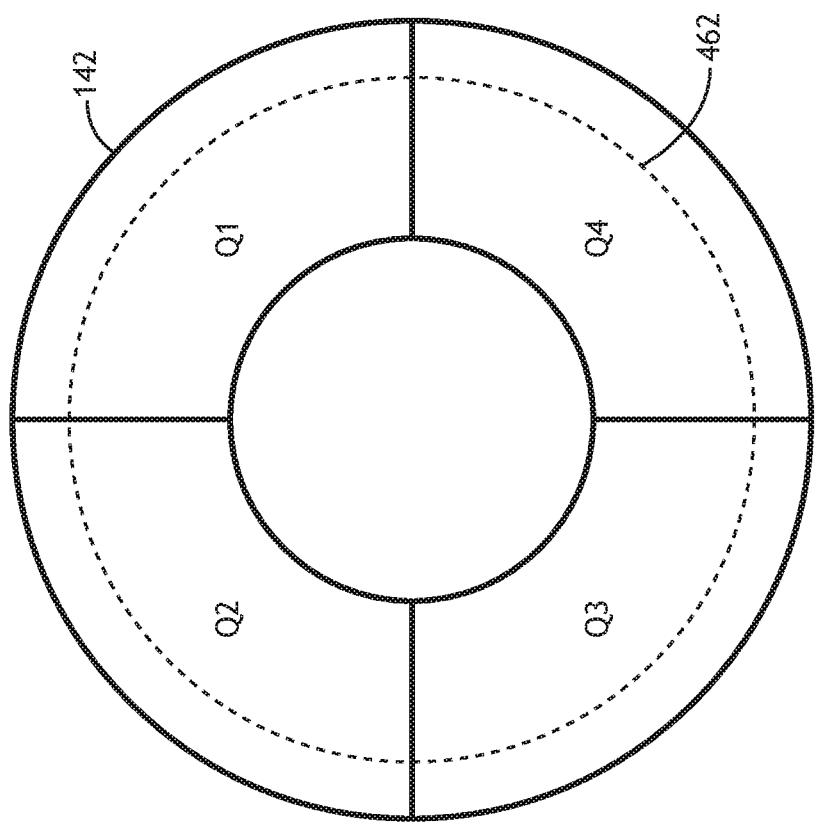

FIG. 4H illustrates the landing pattern 462 of secondary electrons on a segmented electron detector 142, in accordance with one or more embodiments of the present disclosure.

In the presence of residual image beam position drift, such drift may be reduced (or fully eliminated) using feedback from the emittance analyzer assembly 120. For example, when the image beam is properly aligned and the currents intercepted by the second electron detector 142 (e.g., see FIG. 1A) are stable, the difference between any two opposing outer quadrants of a five segment detector (shown in FIG. 4G) should be zero. If the image beam shifts, the difference between opposite outer quadrants will become non-zero and can be used as an error signal to drive an appropriate correction via the deflection optics 124 (e.g., deflection plates) of the emittance analyzer assembly 120. In this regard, the following relationships can be used for deflection correction:

$$(Q1-Q3)/(C+Q1+Q2+Q3+Q4)) \quad \text{Eq. 1}$$

$$(Q2-Q4)/(C+Q1+Q2+Q3+Q4)) \quad \text{Eq. 2}$$

where Q1, Q2, Q3, Q4 and C represent the signal measured by the Q1, Q2, Q3, Q4 and C detection portions of a 5 segment multi-segment detector. It is noted that dividing the differences by the total signal help make these error signals resistant to small changes in image beam current, which may result from variation of the primary beam 104 and variation of secondary emission from sample to sample.

Figure 4I:
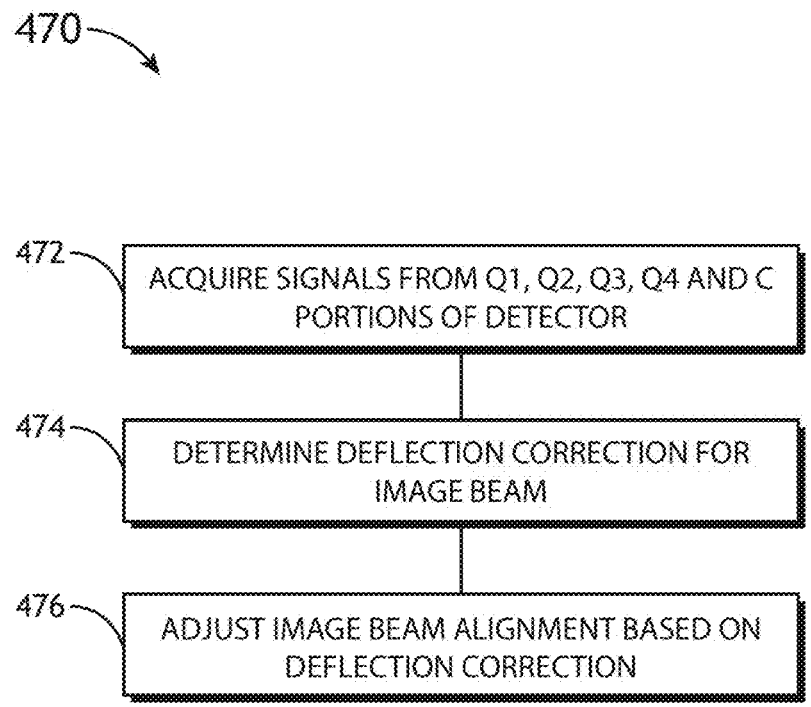

FIG. 4I illustrates a flow diagram 470 depicting a method for correcting beam misalignment in the emittance analyzer 120 (or a similar configuration), in accordance with one or more embodiments of the present disclosure. In step 472, signals are acquired from Q1, Q2, Q3, Q4 and C portions of the multi-segment detector 142. For example, controller 121 may receive measured signals from Q1, Q2, Q3, Q4 and C portions of the multi-segment detector 142. In step 474, one or more deflection corrections may be determined for the image beam. For example, the controller 121 may apply equations 1 and/or 2 described above to determine a deflection correction necessary for aligning the image beam incident on the detector 142. In step 476, the image beam alignment is adjusted based on the determined deflection correction. For example, the controller 121 may direct the set of deflection optics 124 to correct the position of the image beam based on the deflection correction calculated using equations 1 and/or 2.

It is noted that, while the segmented detector 142 of FIG. 4H (or FIG. 1A) is described in the context of the emittance analyzer assembly 120, this is not a limitation on the use of the detector depicted in FIG. 4H. It is recognized herein that the segmented detector of FIG. 4H may be implemented in the context of any electron analysis device, such as, but not limited to, an emittance analyzer or a drift tube/energy filter system.

It is further noted that one or more large detector arrays may be used as one or more of the detectors in the emittance analyzer assembly 120 to improve azimuth and polar angle discrimination. In one embodiment, a large detector array may be used to obtain polar and azimuth angle distributions for each image pixel in one image grab. In another embodiment, following acquisition of polar and azimuth angle distribution maps, 3D images of the surface topology of the sample may be rendered. In another embodiment, polar and azimuth angle distributions may be used to provide 3D metrology information about the sample 110.

In another embodiment, the emittance analyzer assembly 120 may sweep the energy filter 128, while simultaneously acquiring polar and azimuth angle information to extract information about how polar and azimuth angle distributions change as a function of secondary electron energy.

In another embodiment, the emittance analyzer assembly 120, with polar and azimuth angle information, may render images of surface topology with only secondary electrons having energies above the programmable energy filter threshold.

In another embodiment, the emittance analyzer assembly 120 may acquire two images each acquired with a different energy filter threshold and subtract the two images to render darkfield images using only secondary electrons with energies between the two energy filter set points.

In another embodiment, the emittance analyzer assembly 120 may acquire polar and azimuth angle information of secondary electrons above a threshold set by the energy filter 128, while also simultaneously acquiring the average surface potential of the scanned area of the sample 110.

Figure 5A:
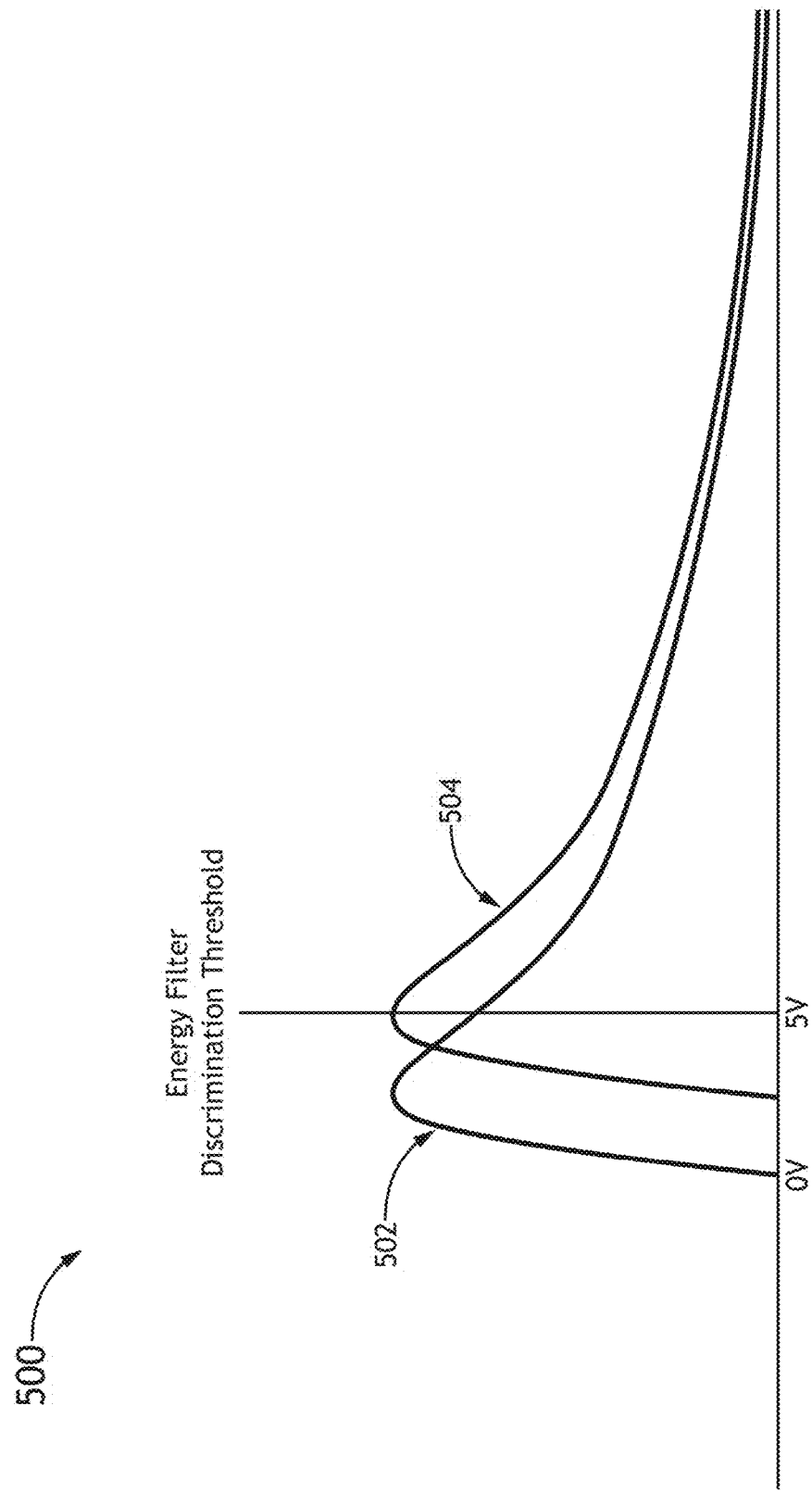

FIG. 5A illustrates a conceptual view 500 of errors introduced during energy discrimination due to surface charging of the sample by the primary beam.

In some embodiments, the control voltages of emittance analyzer 120 are referenced to the surface potential of the sample 110. In the case of insulating, charging wafers, tracking the surface potential of the image-beam emission point may be performed.

Curve 502 depicts the secondary electron energy spectrum obtained from a neutral surface (i.e., surface potential of 0 V). Curve 504 depicts the secondary electron energy spectrum obtained from a charged surface. It is noted that the potential energy imparted on the secondary electrons from a surface voltage shifts the secondary electron energy distribution. Further, charging during imaging of insulating surfaces will cause the secondary electron energy spectrum to change with time. This effect introduces errors in the desired energy discrimination threshold. For example, as shown in FIG. 5A, an energy discrimination threshold is set to reject secondary electrons that are 5 eV and below. In the case where the secondary electron emission surface charges 2.5 V positive, the energy filter discrimination distribution threshold is shifted by that amount and an error of 2.5 eV is introduced in the desired 5 eV threshold.

Reference of control voltages to sample surface potentials is described generally in U.S. Patent Publication 2013/0032729 and U.S. Pat. No. 7,141,791, which are incorporated above by reference in the entirety.

Figure 5B:
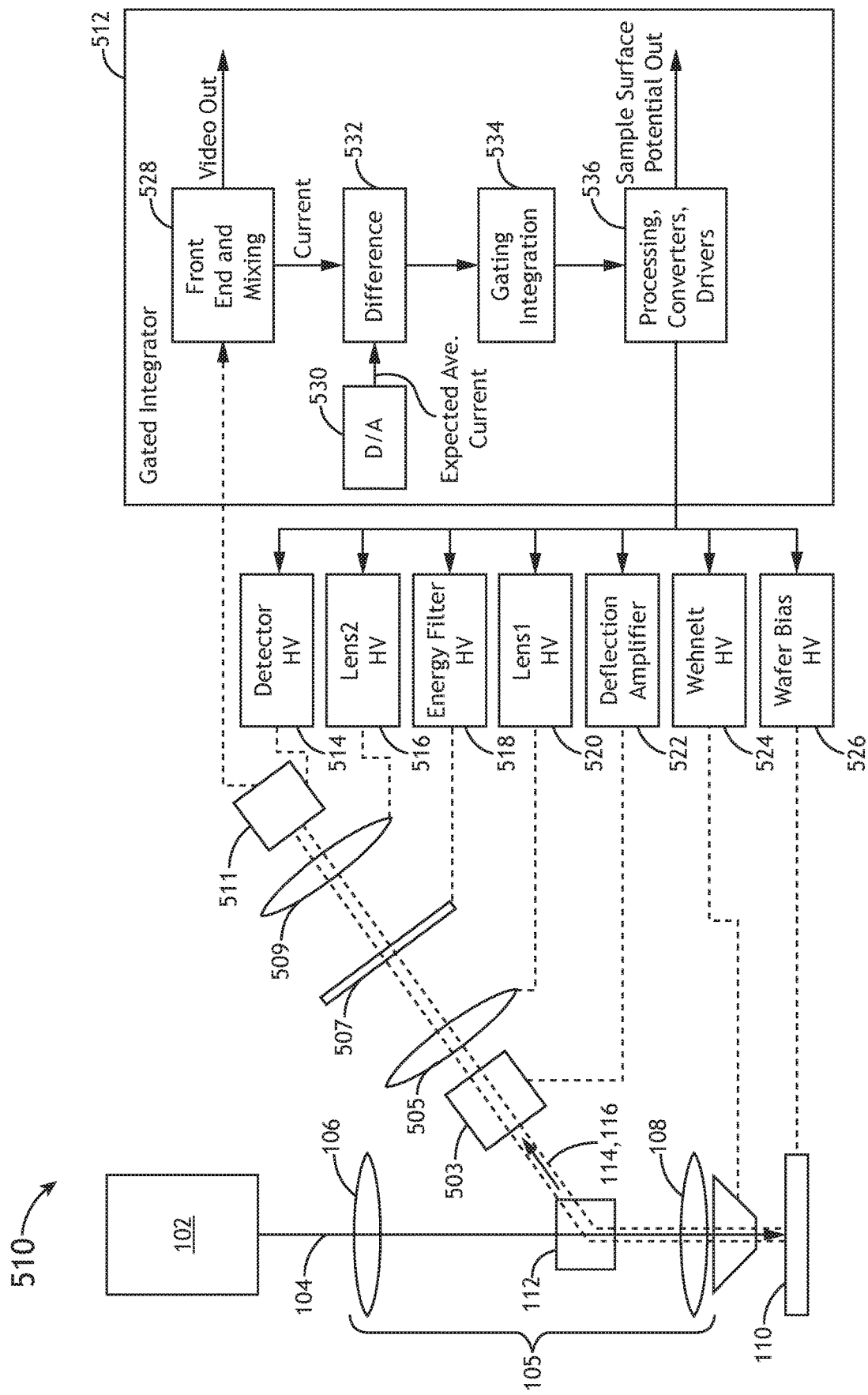

FIG. 5B illustrates a block diagram view of the system 500 equipped with a gated integrator 512, in accordance with one or more embodiments of the present disclosure. In one embodiment, the gated integrator 512 is used to close the control loop between the sample surface potential and the image path optics so as to eliminate charge induced image artifacts. In this regard, the energy filter threshold offset may be locked to the sample surface potential.

It is noted that the term "gated" is used to note that an input may be "gated" off from the input of the integrator in order to ignore unwanted surface voltage information. For example, it may be desirable to gate off the input during one or more of the operational settings: during imaging of the edges of scan frames, during flyback, when the beam is blanked and the like.

The imaging optics may include, but are not limited to, a set of deflection optics 503, a first electron-optic lens 505, an energy filter 507, a second electron-optic lens 509 and a detector 511 (e.g., segmented detector). In one embodiment, the image path optics forming the control loop with the gated integrator 512 includes the energy filter 507. The energy filter 507 may include, but is not limited to, a planar mesh, a hemispherical/concave mesh or multiple meshes.

In one embodiment, the gated integrator 512 includes a front end and mixing module 528 and a D/A module 530. In one embodiment, a detector output is received by the front end and mixing module 528. For instance, the output of each of a multi-channel segmented detector, such as detector 142, are transmitted to the front end and mixing module 528. In turn, the total detector current is transmitted from module front end and mixing module 528 to the difference module 532. Further, the front end and mixing module 528 may provide a video output. The expected average value of the detector current is transmitted from the D/A module 530 to the difference module 532. The difference module 532 then compares the detector current (e.g., sum of all channels of a segmented detector 142) to the expected average value of the detector current for a specific energy threshold. It is noted that differences between the expected value of the detector current and the actual total value of the detector current indicate that more or fewer electrons are passing the energy filter than expected. The output of the difference module 532 is then transmitted to the gating/integration module 534. The difference from the difference module 532 is then integrated by the gating/integration module 534 with a predetermined time constant. Therefore, the output tracks the surface potential of the sample.

In turn, the output of the gating/integration module 534 is transmitted to one or more signal processing elements 536 (e.g., processing circuitry, converters, drivers and the like). The processing elements 536 then feed the offset from the gating/integration module 534 to the energy filter 507 as an offset, thereby preserving the energy filter discrimination threshold. In addition, the processing elements 536 provide a sample surface potential output.

In one embodiment, the integration time constant can be set to a range of values depending on the amount of averaging desired. In another embodiment, the integrator can be gated, where its output is held at the value when gated, to ignore the detector during fly-back or to lock the control loop on only portions of the image area. In one embodiment, the gated integrator 512 locks with a signal from a pre-scan area outside the field of view and start closed loop image acquisition with that pre-scan lock value. In another embodiment, the gated integrator 512 locks with a signal from a pre-scan area outside the image area and holds that lock value during image acquisition. In another embodiment, the gated integrator 512 uses a signal from only a portion of the image area and gates or blocks signals from other areas of the image. In another embodiment, the gated integrator 512 uses a gated signal generated during beam fly-back. In another embodiment, the system 510 saves one or more lock values of the gated integrator 512 corresponding to different image sites in a recipe and forces the gated integrator 512 to use those lock values at the start of each image acquisition during the execution of the recipe.

In another embodiment, the gated integrator 512 may transmit one or more control signals to the control circuitry 514, 516, 518, 520, 522, 524 and 526 to control various components of the electron-optical system 500 responsive to the output of the gated integrator 512.

It is noted that one disadvantage of the approach depicted in FIG. 5B is that small changes in secondary electron emission from wafer to wafer and changes in primary beam current or detector gain over time may introduce errors in the predetermined detector current causing incorrect energy filter threshold set points. This can be partially mitigated by an auto calibration procedure at the beginning of a recipe or during stage moves between image sites. In a first step, the calibration procedure may include setting the energy filter to 0 V. In a second step, the calibration procedure may include measuring the detector current. In a third step, based on prior knowledge of the secondary electron distribution, the calibration procedure may include calculating an expected detector current value for the chosen energy filter discrimination threshold.

Figure 5C:
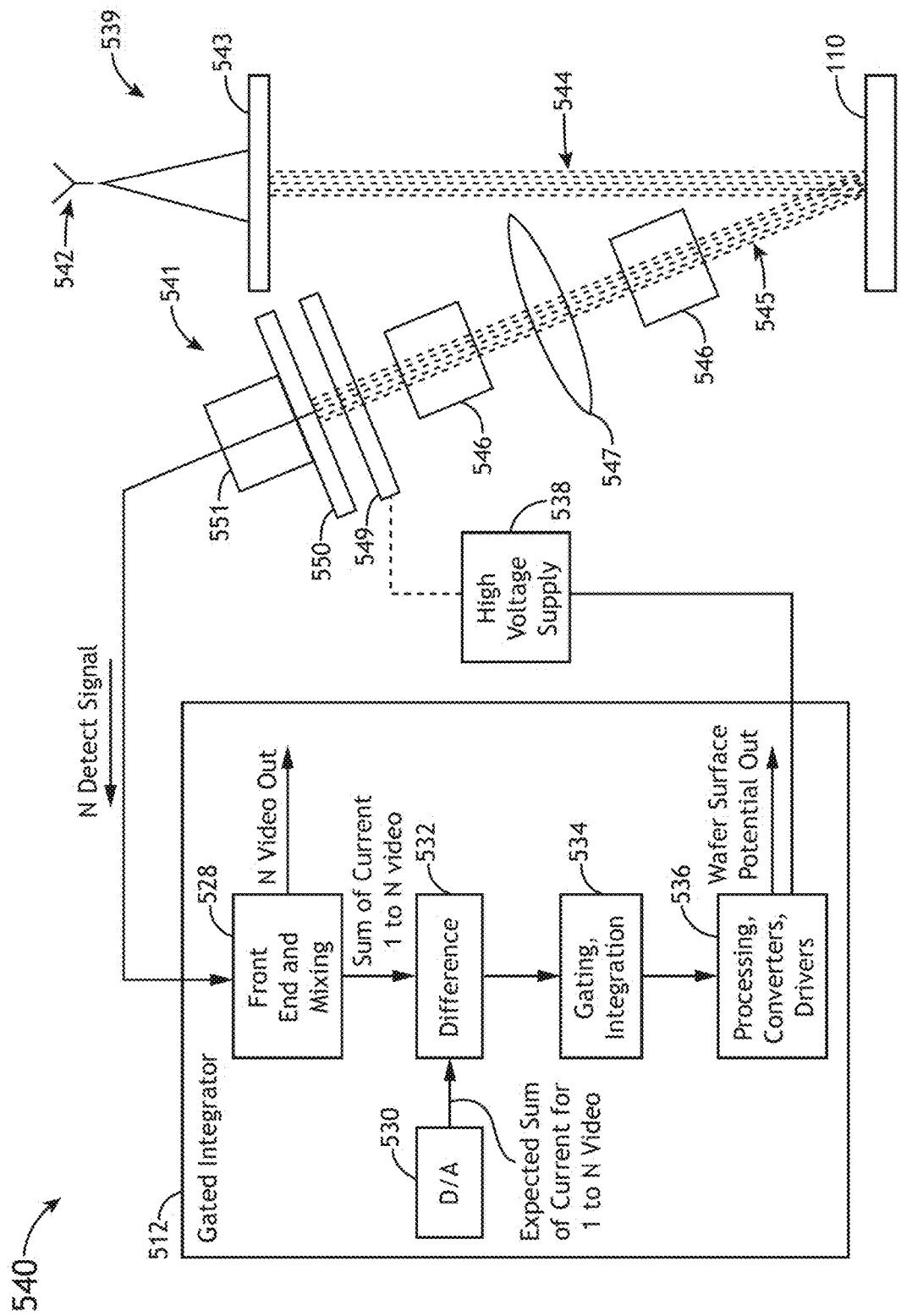

FIG. 5C illustrates a block diagram view of the system 540 equipped with the gated integrator 512 used to establish the control loop for a multi-beam energy filter array, in accordance with one or more embodiments of the present disclosure.

In one embodiment, the system 540 includes the multi-beam electron-optic system 541. In one embodiment, the system 539 includes a cathode 542 and a multi-beam aperture 543 to form N number of primary beams 544. In response to the N primary beams 544, the sample 110 emits N secondary electron beams 545. The electron optical system 539 further includes analyzer optics 541. In one embodiment, the analyzer optics 539 include one or more deflection optics 546, a first electron-optic lens 547, an energy filter array 549, a detector array 550 and a set of N number of detector pre-amplifiers 551.

In one embodiment, the beamlet energy filters 549 are in common and controlled as a group. It is noted that in settings where the beamlet energy filters 549 are controlled globally the sum of all primary beamlet currents can be used to lock the control loop providing a greatly reduced lock time. In another embodiment, each beamlet energy filter of the multiple energy filters 549 is controlled separately. In this regard, each beamlet energy filter 549 is independently controlled.

It is noted that the control steps described in the context of the gated integrator 512 of FIG. 5B may be generally extended to the multi-beam let context of FIG. 5C. In addition, the processing circuitry 536 may adjust the potential of the energy filter aperture 549 via the direct high voltage supply 538.

In one embodiment, the system 540 may obtain a multi-beam image ensemble using a second energy filter setting and take the difference between the first and second image ensembles to obtain a bandpass multi-beam image ensemble. In another embodiment, the system 540 may utilize the control loop in a control-hold-control-hold sequence, such that only a portion of the image frame is acquired with the control loop running.

In another embodiment, the system 540 utilizes the energy filter during recipe setup to record a surface charge profile, while the image is being acquired and uses this profile to control the energy filter potential during image acquisition when the recipe is executed. Alternatively, the system 540 may bias the control loop during image acquisition when the recipe is executed.

It is noted that the drift-tube/energy-filter and the emittance analyzer assembly benefit from having their control voltages referenced to the wafer surface potential. However, because they both employ a drift region, errors in the control reference voltage cause large changes in the radial distribution of the secondary electrons in the plane of the detector.

Figure 5D:
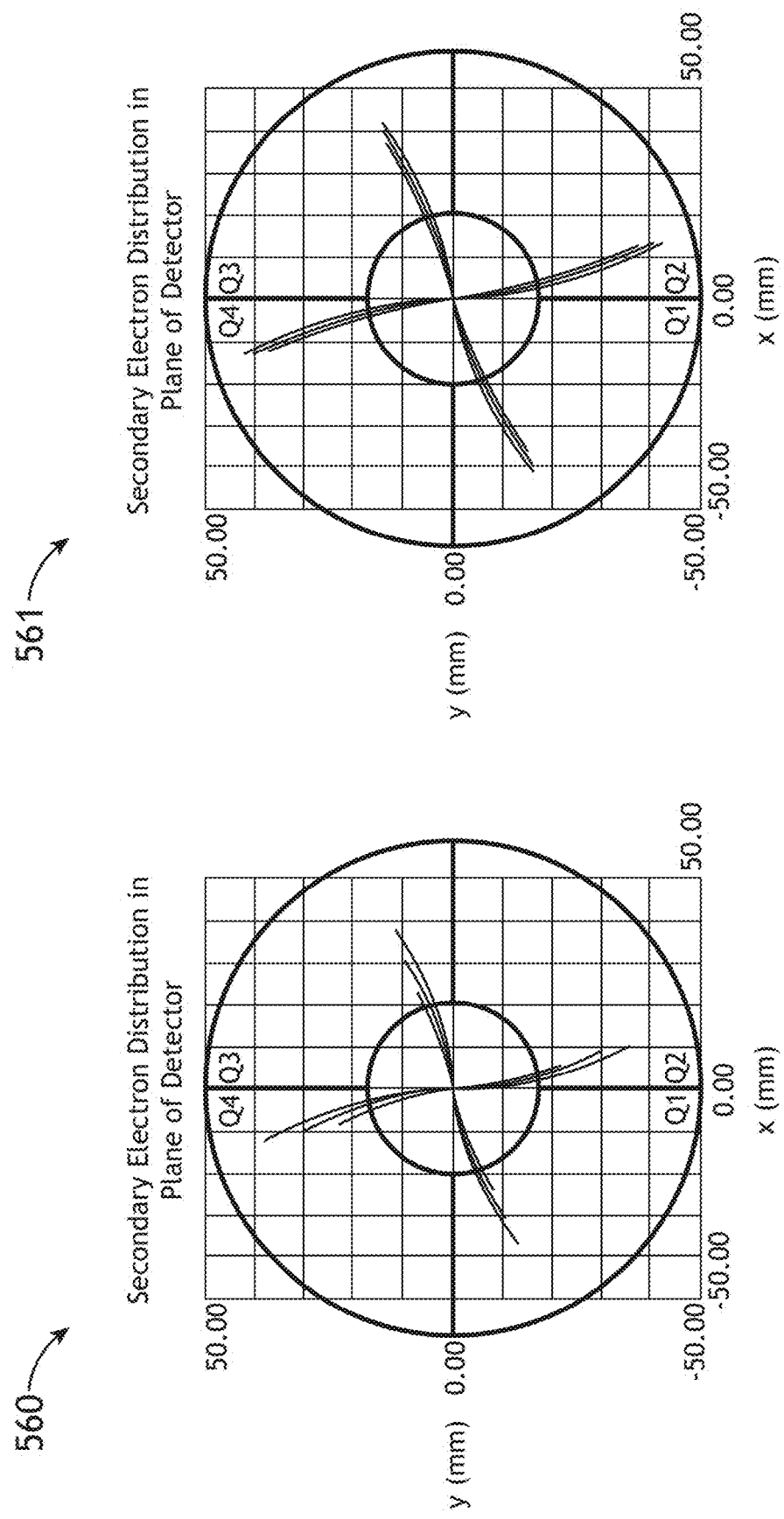
Figure 5E:
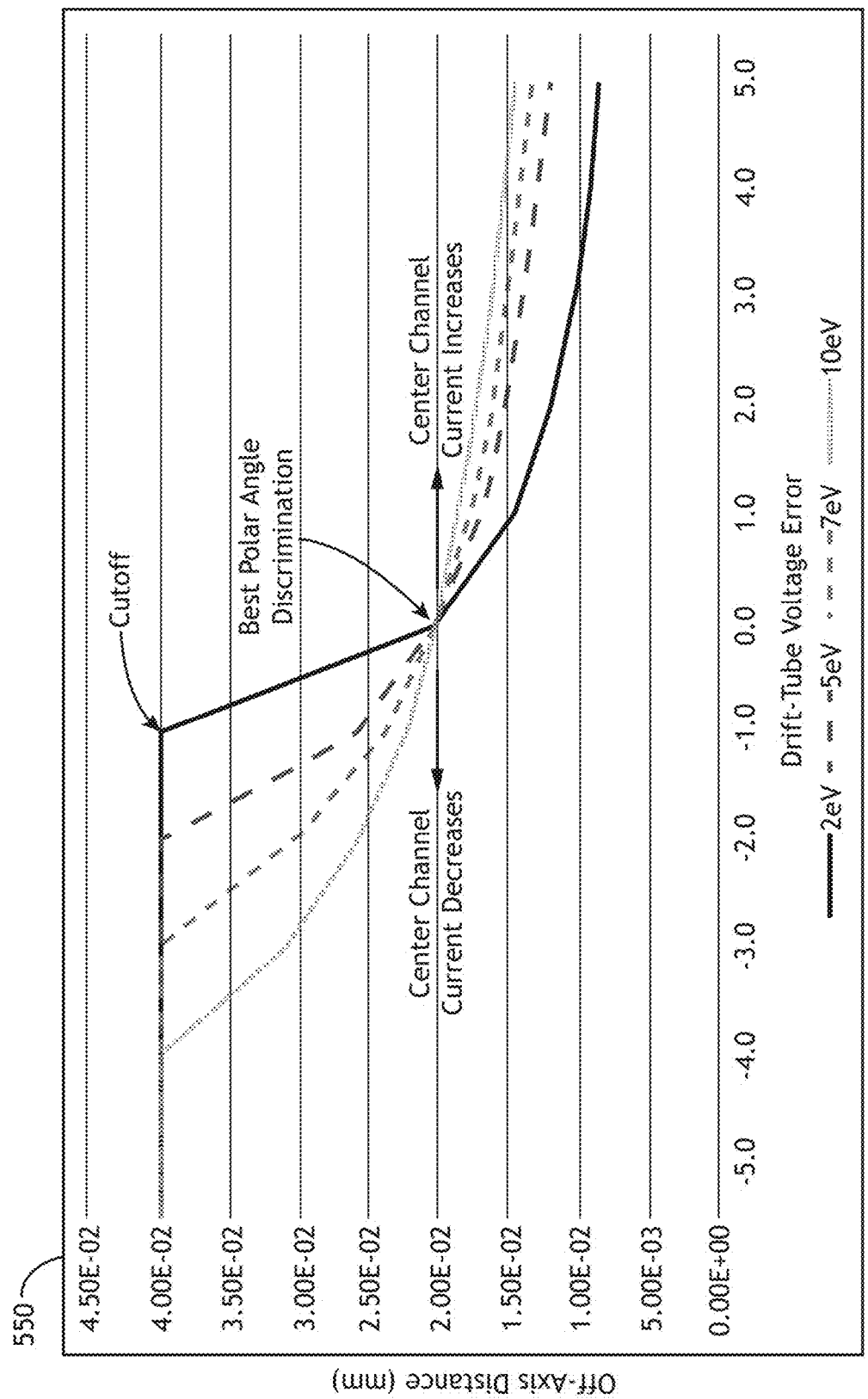

FIG. 5D illustrates a secondary electron distribution 560 in the plane of the detector for a charged surface with no loop control. FIG. 5E illustrates a secondary electron distribution 561 in the plane of the detector for a charged surface with a closed loop between the wafer surface potential and the emittance analyzer assembly 120. By using the ratio of (center channel)/(outer channels) from the second detector 142 to generate an error signal for a gated integrator, the polar angle discrimination drift due to charging can be stabilized (see graph 561).

FIG. 5E illustrates graph 550 that depicts the relationship between drift-region potential errors and changes in the ratio of center channel divided by the sum of the four outer quadrants. An error signal derived from the ratio of detector channels will be immune to errors from primary beam current changes, secondary emission changes and gain changes in the video chain.

Figure 5F:
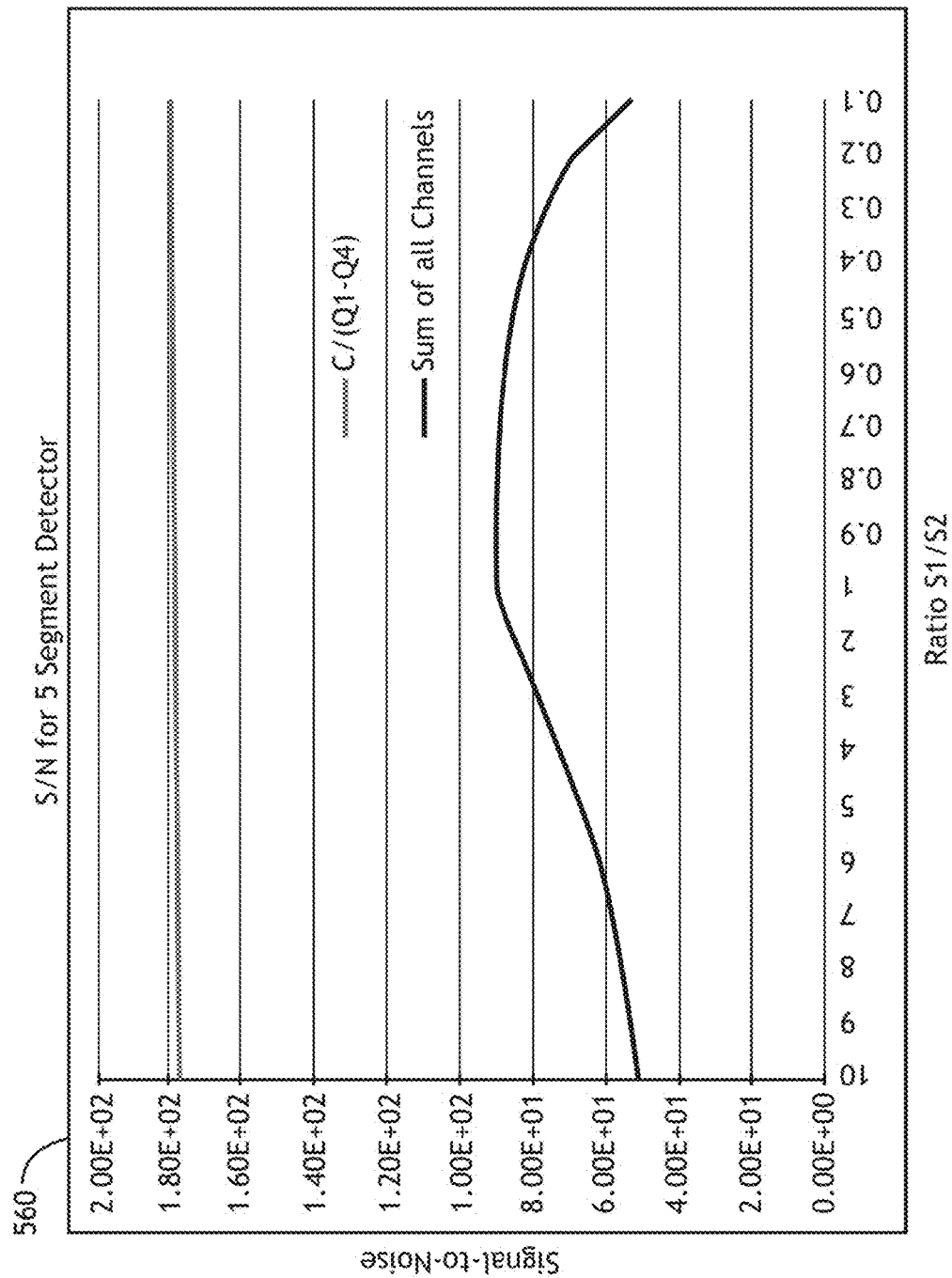

By way of example, if a 1 nA current is assumed in the secondary electron beam, the signal-to-noise of a signal consisting of the (center channel)/(outer channels) has the Taylor series approximation shown in graph 560 of FIG. 5F. Graph 560 also depicts the sum of all channels Q1-Q4 and C.

Figure 5G:
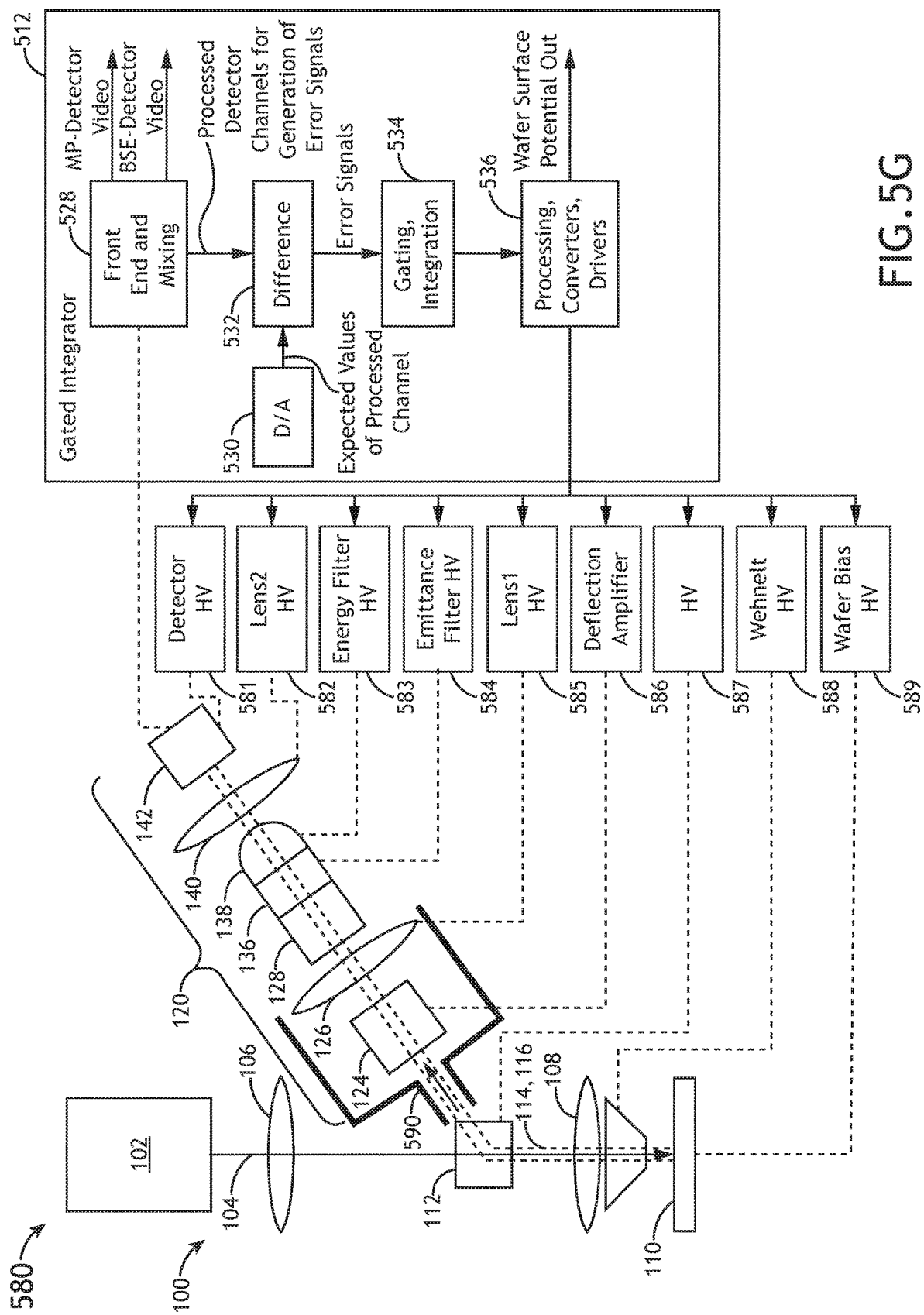

FIG. 5G illustrates a servo system 580 for pinning the emittance analyzer 120 to the surface potential of the sample 110. It is noted that the embodiments and components described previously herein with respect to the gated integrator 512 should be interpreted to extend to the embodiment illustrated in FIG. 5G. In one embodiment, the image path optics forming the control loop with the gated integrator 512 includes the emittance analyzer assembly 120. For example, everything from the deceleration region entrance to the detector may serve as image path optics, whereby the reference potentials for these components are determined by the gated integrator 512. In another embodiment, the gated integrator may control the potentials of the various components using control circuitry components 581-589.

In another embodiment, the system 580 includes an accelerating liner 590 situated about the image path from the splitter element 112 to the entrance of the emittance analyzer deceleration region to minimize the transit time of the image beam. It is noted that the accelerating liner may reduce transit time induced errors in polar angle discrimination.

It is noted herein that the gated integrator scheme implemented in the context of the emittance analyzer 120 yields real-time (within the bandwidth of the control loop) surface potential of the sample 110. In one embodiment, the emittance analyzer 120 of system 580 may be used to construct potential maps of the sample surface.

Figure 5H:
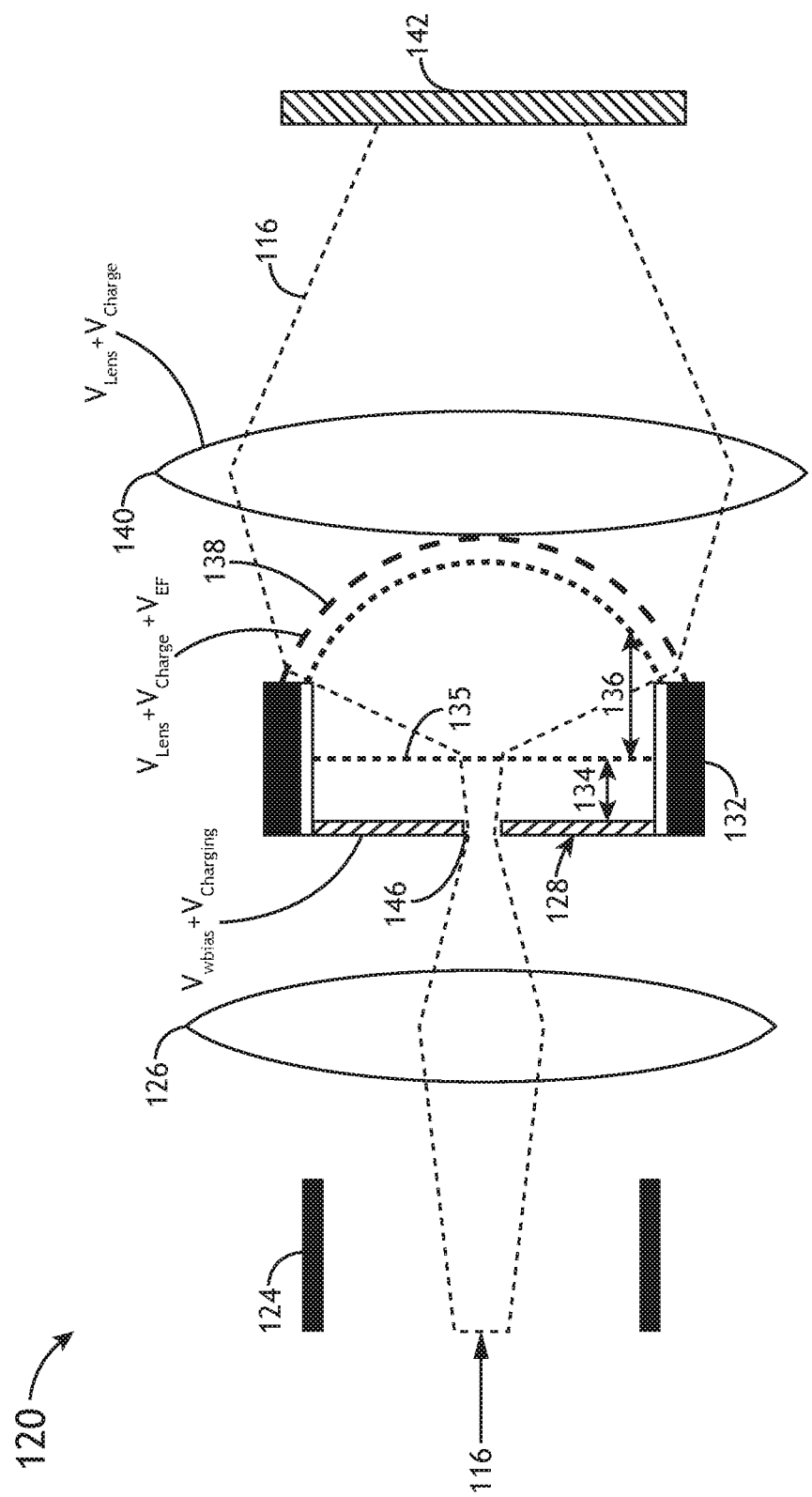

FIG. 5H illustrates the elements of the emittance analyzer 120 that are controlled, or "servoed," by the gated integrator 512. The scheme may present a static potential environment to the image-beam. In one embodiment, all elements between and including the first detector 128 and the second detector 142 are floated at the surface potential of the sample 110. It is noted that the secondary electrons 116 from the sample 110 are accelerated as they leave the sample 110 and changes in their energy due to surface charging are minor. In one embodiment, one or more components of the emittance analyzer assembly 120 are servoed with the sample surface charge voltage so that the electric field environment presented to the secondary electrons is constant even in the presence of changing surface voltage.

Figure 5I:
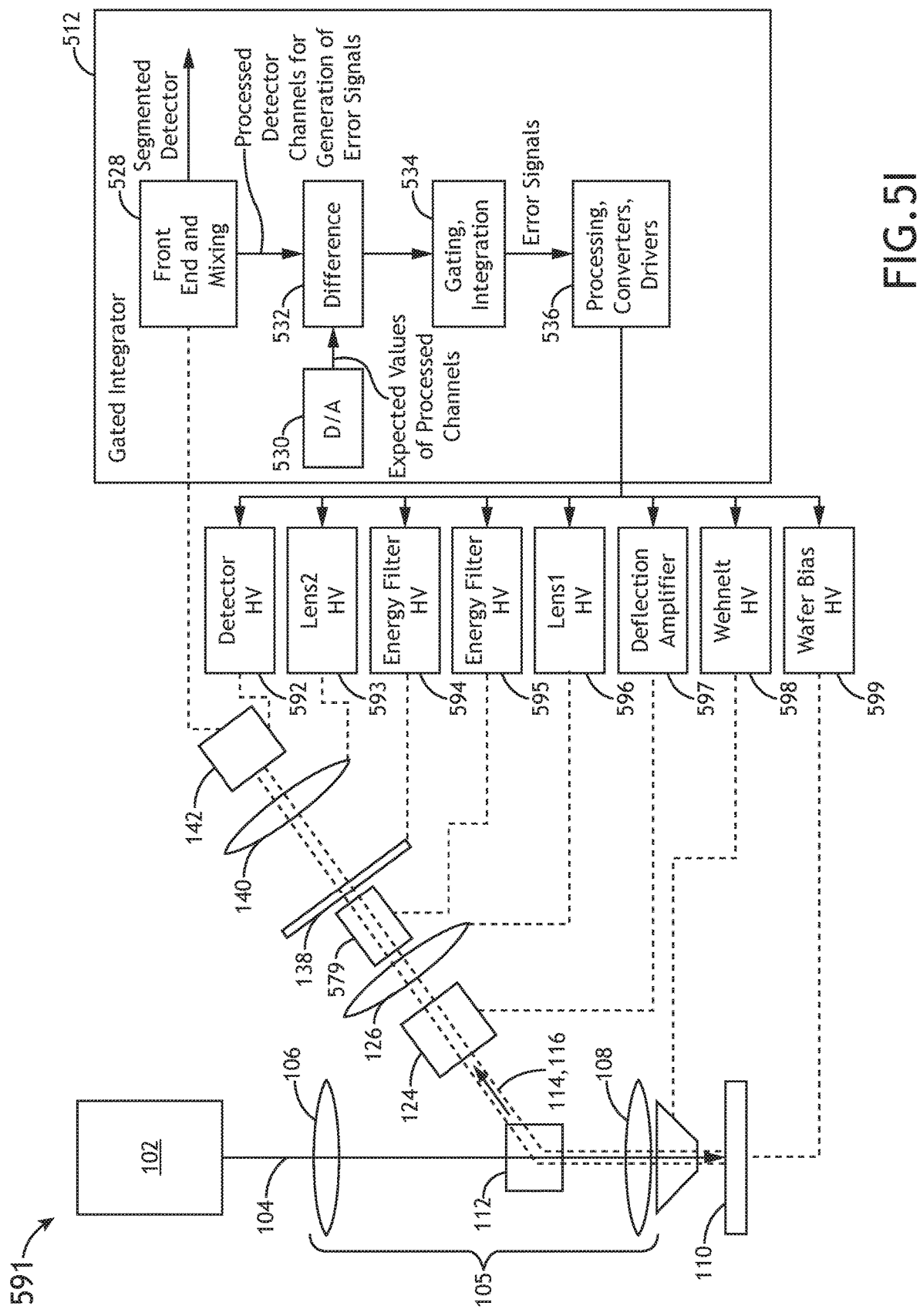

FIG. 5I illustrates a block diagram view of system 591 equipped with a gated integrator 512, in accordance with one or more embodiments of the present disclosure. In one embodiment, the gated integrator 512 is used to close the control loop containing a drift tube 579. It is noted that the embodiments and components described previously herein with respect to the gated integrator 512 should be interpreted to extend to the embodiment illustrated in FIG. 5I. A drift tube for use in the embodiment of FIG. 5I is described generally in U.S. Pat. No. 7,141,791, which is incorporate above by reference in the entirety.

In another embodiment, the gated integrator may control the potentials of the various components using control circuitry components 592-599.

Figure 6A:
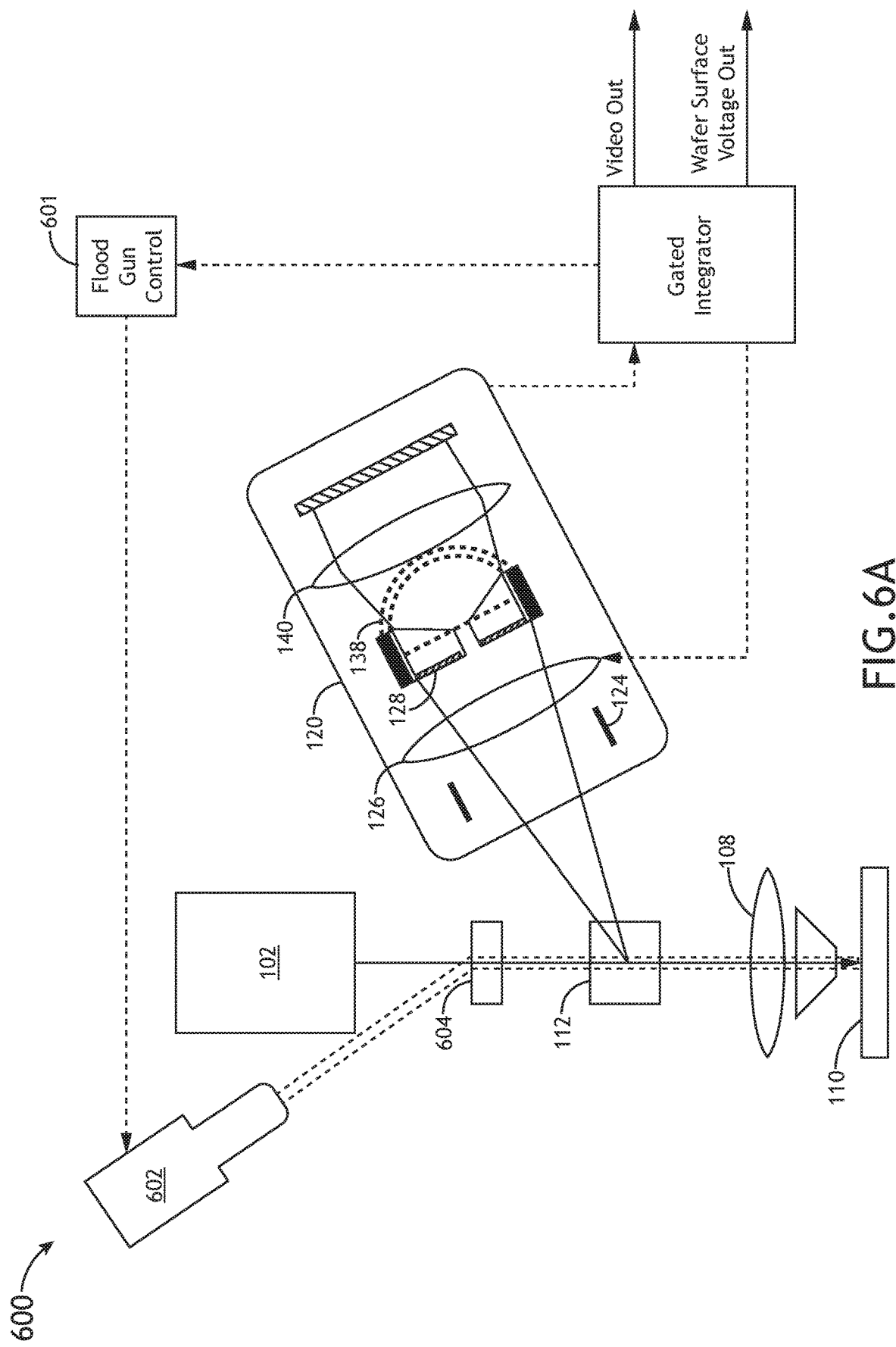

FIG. 6A illustrates a system 600 equipped with in-situ flood, gate integrator and the emittance analyzer capabilities described previously herein, in accordance with one or more embodiments of the present disclosure. In one embodiment, the system 600 includes the emittance analyzer assembly 120 and the gated integrator 512. In another embodiment, the system 600 includes an in-situ flood gun 602 and a flood gun controller 601. In an alternative embodiment, as discussed previously herein, the in-situ flooding may be provided using the electron source 102.

The in-situ flood gun 602 and controller 601 (or electron source 102) may be configured in combination with the emittance analyzer assembly 120 to pre-dose the sample 110 to a predetermined voltage reliably and repeatedly using feedback from the emittance analyzer assembly 120 during flooding.

Figure 6B:
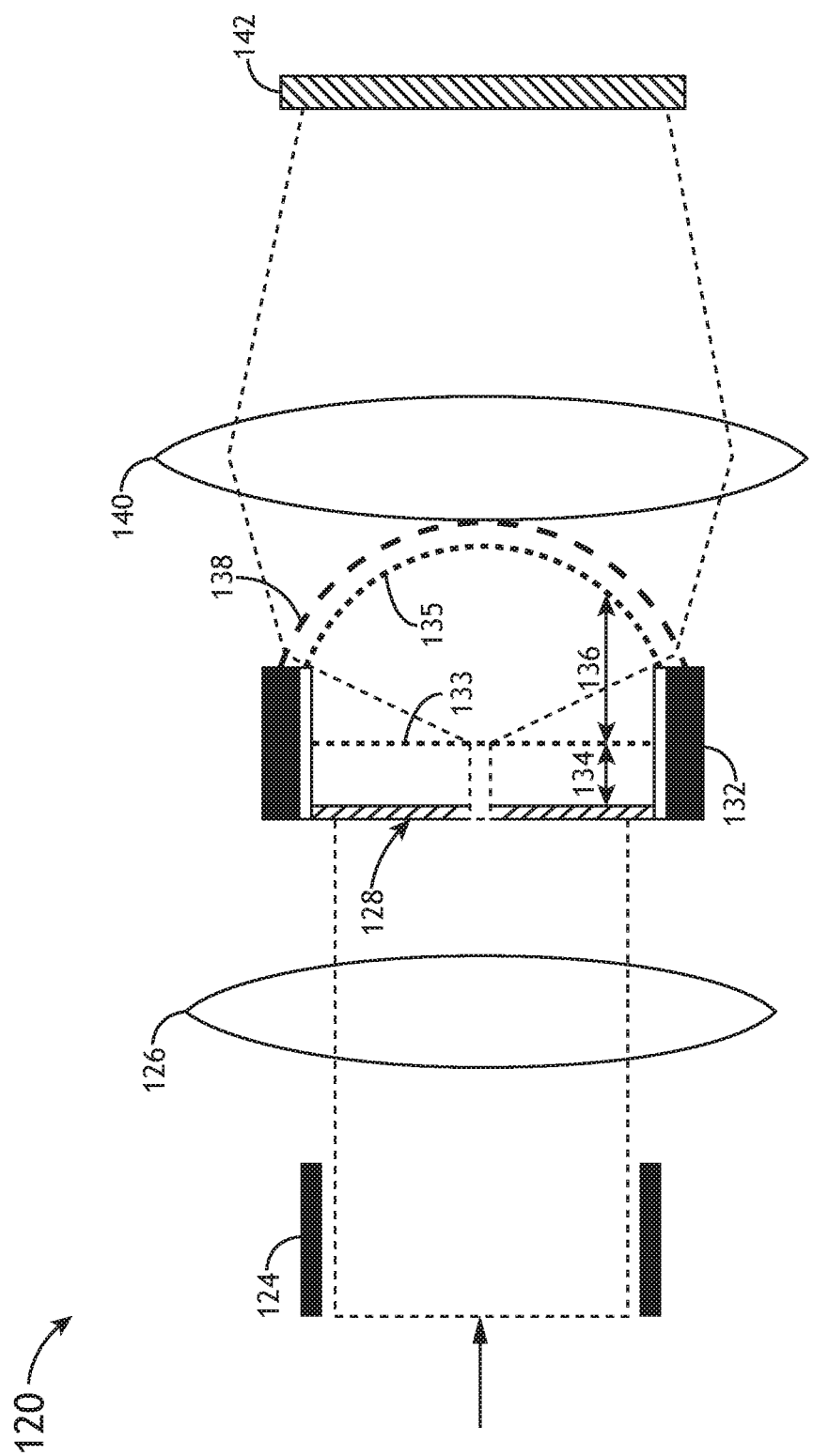

In one embodiment, during the coarse stage travel, the emittance analyzer assembly 120 high voltage is set to a value determined during recipe setup. In another embodiment, during the course stage settle, the flood gun 602 and the flood beam deflector 604 are energized and the first electron detector 128 in the emittance analyzer assembly 120 is turned off. Further, the secondary electrons from the flood beam are routed to the deflector by the splitter element 112. As shown in FIG. 6B, the first electron detector 128 eliminates the majority of the in-situ secondary electrons, thereby protecting the second electron detector 142 from saturation. As the surface of the sample 110 charges, the secondary electron energies approach the cutoff energy of the energy filter 138. In this mode, the energy filter 128 need not be accurate but must be precise and repeatable. As secondary electrons begin to get rejected by the energy filter 128, the drop in detector current is sensed by the gated integrator 512, which, in turn, sends a signal to the flood gun controller 601 and the flood gun is turned off.

During the stage fine settling, the emittance analyzer assembly 120 is already set close to the surface potential of the sample 110 and only a small pre-scan outside the FOV is required to lock the gated integrator 512. Following locking the gated integrator 512 image acquisition begins.

It is noted that in the case of semiconductors that charge in order for the emittance analyzer assembly 120 to operate in a stable manner a large area in-situ pre-dose may be required.

Figure 6C:
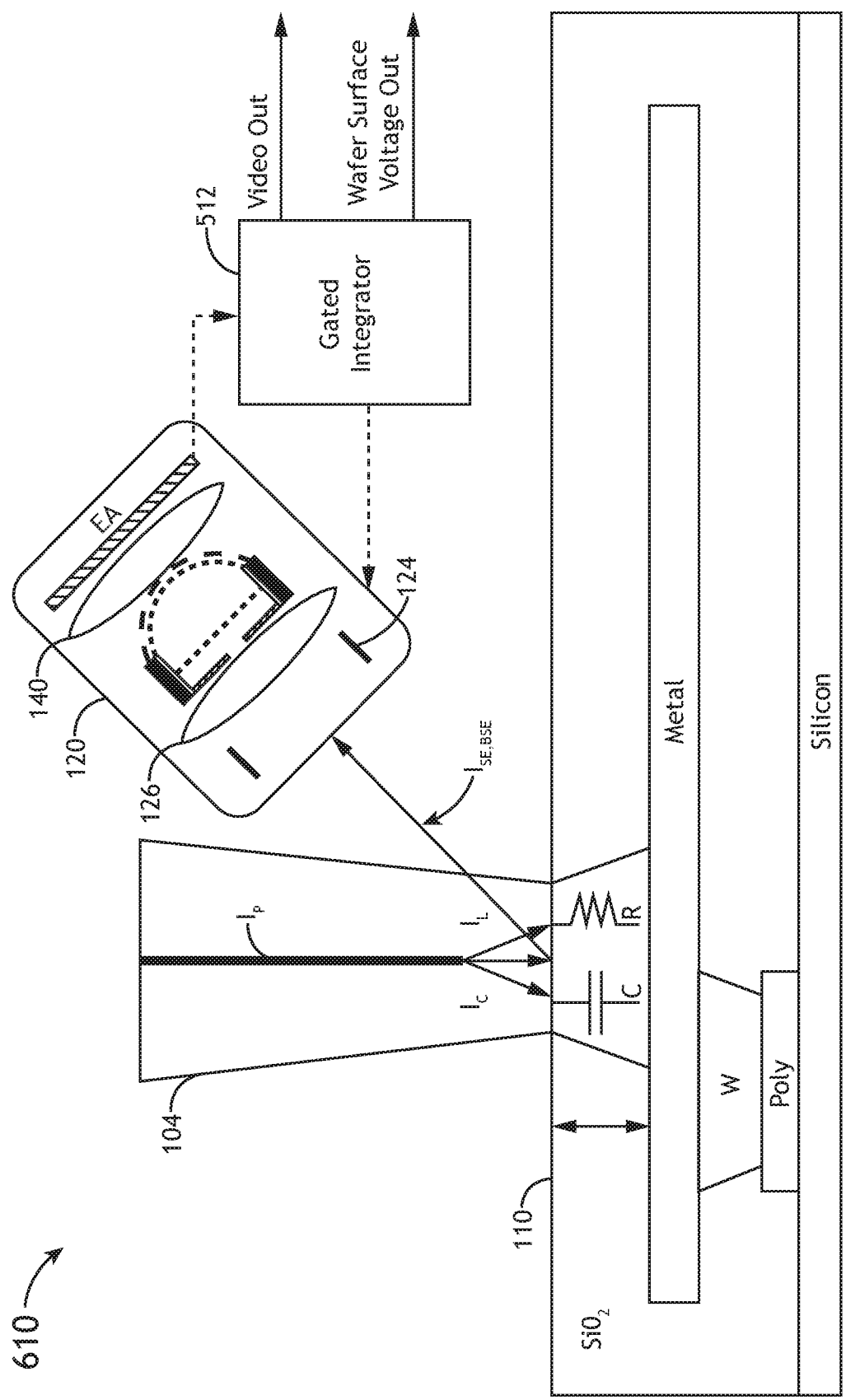

FIG. 6C illustrates a conceptual view 610 of the relationship between charge build up and the layer thickness of the sample 110. The sample 110 includes a semiconductor device sample including a silicon layer and a poly layer and a metal layer coated in an $SiO_2$ layer. Further, $I_p$ represents the initial current 612 associated with the primary beam. $I_c$ represents the current contribution associated with the charge held in the surface. $I_L$ represents the leakage current associated with charge that has leaked from the landing spot. $I_{SE,BSE}$ is the current associated with the secondary electrons and backscattered electrons emitted by the sample surface. It is noted that by radiating a known area with the primary beam 104 and allowing the emittance analyzer assembly 120 to track the wafer surface potential, the rate of charge can be obtained. Further, with prior knowledge of the process and characterization during recipe setup, it is possible to derive the layer critical dimension (CD).

In one embodiment, the one or more controllers (e.g., controller 121) or other like control systems may include one or more processors communicatively coupled to an output device (e.g., detector 142) and memory. In one embodiment, the one or more processors are configured to execute a set of program instructions maintained in memory.

The one or more processors of controller may include any one or more processing elements known in the art. In this sense, the one or more processors may include any microprocessor device configured to execute algorithms and/or instructions. In one embodiment, the one or more processors may consist of a desktop computer, mainframe computer system, workstation, image computer, parallel processor, or other computer system (e.g., networked computer) configured to execute a program configured to operate one or more portions of the various system and sub-system embodiments, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium. Moreover, different subsystems of the system(s) may include processor or logic elements suitable for carrying out at least a portion of the steps described throughout the present disclosure. Therefore, the above description should not be interpreted as a limitation on the present disclosure but merely an illustration.

The memory may include any storage medium known in the art suitable for storing program instructions executable by the associated one or more processors. For example, the memory may include a non-transitory memory medium. For instance, the memory may include, but is not limited to, a read-only memory, a random access memory, a magnetic or optical memory device (e.g., disk), a magnetic tape, a solid state drive and the like. In another embodiment, it is noted herein that the memory is configured to store one or more results from the various systems/sub-systems and/or the output of the various steps described herein. It is further noted that memory may be housed in a common controller housing with the one or more processors. In an alternative embodiment, the memory may be located remotely with respect to the physical location of the processors and controller. For instance, the one or more processors of controller may access a remote memory (e.g., server), accessible through a network (e.g., internet, intranet and the like). In another embodiment, the memory stores the program instructions for causing the one or more processors to carry out the various steps described through the present disclosure Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A scanning electron microscopy apparatus comprising:
   an electron beam source configured to generate an electron beam;
   a set of electron-optical elements to direct at least a portion of the electron beam onto a portion of a sample;
   an emittance analyzer assembly; and
   a splitter element configured to direct at least a portion of at least one of secondary electrons or backscattered electrons emitted by a surface of the sample to the emittance analyzer assembly,
   wherein the emittance analyzer assembly is configured to image at least one of the secondary electrons or the backscattered electrons, wherein the emittance analyzer assembly includes:
      a set of deflection optics;
      a first electron-optic lens;
      a first electron detector including a center aperture, wherein the first electron detector is configured to collect at least one of a portion of the secondary electrons or a portion of the backscattered electrons;

a first mesh element disposed downstream from the first electron detector;

a second mesh element disposed downstream from the first mesh element, wherein the first electron detector and the first mesh element form a deceleration region, wherein the first mesh element and the second mesh element form a drift region;

an energy filter disposed downstream from the second mesh element;

a second electron-optic lens; and a second electron detector configured to collect at least one of an additional portion of the secondary electrons or an additional portion of the backscattered electrons.

2. The scanning electron microscopy apparatus of claim 1, wherein the set of deflection optics is configured to align the image beam with one or more components of the emittance analyzer assembly.

3. The scanning electron microscopy apparatus of claim 1, wherein the set of deflection optics includes at least one of a set of electrostatic deflectors or magnetic deflectors.

4. The scanning electron microscopy apparatus of claim 1, wherein the set of deflection optics is disposed within an acceleration liner.

5. The scanning electron microscopy apparatus of claim 1, wherein the first electron-optic lens is disposed downstream from the set of deflection optics.

6. The scanning electron microscopy apparatus of claim 1, wherein the first electron-optic lens comprises:

at least one of an electrostatic lens or a magnetic lens.

7. The scanning electron microscopy apparatus of claim 1, wherein the first electron detector is held at ground.

8. The scanning electron microscopy apparatus of claim 1, wherein the first mesh element is disposed downstream from the first electron detector and is held at a potential equal to the surface potential of the sample.

9. The scanning electron microscopy apparatus of claim 1, wherein the second mesh element is disposed downstream from the first mesh element and is held at a potential equal to the surface potential of the sample.

10. The scanning electron microscopy apparatus of claim 1, wherein the first mesh element comprises a planar wire mesh.

11. The scanning electron microscopy apparatus of claim 1, wherein the second mesh element comprises a hemispherical wire mesh.

12. The scanning electron microscopy apparatus of claim 1, wherein the energy filter comprises a hemispherical wire mesh.

13. The scanning electron microscopy apparatus of claim 1, wherein at least one of the first electron detector or the second electron detector comprise:

at least one of a multi-channel plate detector, a solid state detector or a scintillator detector.

14. The scanning electron microscopy apparatus of claim 1, wherein at least one of the first electron detector or the second electron detector are segmented into two or more segments.

15. The scanning electron microscopy apparatus of claim 1, wherein the emittance analyzer assembly is configured to operate in secondary electron and backscattered electron imaging mode.

16. The scanning electron microscopy apparatus of claim 1, wherein the emittance analyzer assembly is configured to operate in backscattered electron and high aspect ratio electron imaging mode.

17. The scanning electron microscopy apparatus of claim 1, wherein the emittance analyzer assembly is configured to operate in backscattered electron only imaging mode.

18. The scanning electron microscopy apparatus of claim 1, wherein the electron source is configured to apply an in-situ flood pre-dose to the sample.

19. The scanning electron microscopy apparatus of claim 1, further comprising:

a flood gun configured to apply an in-situ flood pre-dose to the sample.

20. The scanning electron microscopy apparatus of claim 1, further comprising:

a gated integrator.

21. The scanning electron microscopy apparatus of claim 20, wherein the gated integrator is configured to lock one or more components of the emittance analyzer assembly to the surface potential of the sample.

22. An emittance analyzer assembly comprising:

a set of deflection optics;

a first electron-optic lens;

a first electron detector including a center aperture, wherein the first electron detector is configured to collect at least one of a portion of the secondary electrons or a portion of the backscattered electrons;

a first mesh element disposed downstream from the first electron detector;

a second mesh element disposed downstream from the first mesh element, wherein the first electron detector and the first mesh element form a deceleration region, wherein the first mesh element and the second mesh element form a drift region;

an energy filter disposed downstream from the second ground mesh element;

a second electron-optic lens; and a second electron detector configured to collect at least one of an additional portion of the secondary electrons or an additional portion of the backscattered electrons.

23. The emittance analyzer assembly of claim 22, wherein the emittance analyzer assembly is configured to operate in secondary electron and backscattered electron imaging mode.

24. The emittance analyzer assembly of claim 22, wherein the emittance analyzer assembly is configured to operate in backscattered electron and high aspect ratio electron imaging mode.

25. The emittance analyzer assembly of claim 22, wherein the emittance analyzer assembly is configured to operate in backscattered electron only imaging mode.

26. The emittance analyzer assembly of claim 22, wherein the emittance analyzer assembly is configured to switch between a secondary electron and backscattered electron imaging mode, a backscattered electron and high aspect ratio electron imaging mode, and a backscattered electron only imaging mode.

27. A system comprising:

a first emittance analyzer assembly; and a second emittance analyzer assembly, wherein at least one of the first emittance analyzer assembly or the second emittance analyzer comprises:

a set of deflection optics;

a first electron-optic lens;

a first electron detector including a center aperture, wherein the first electron detector is configured to collect at least one of a portion of the secondary electrons or a portion of the backscattered electrons;
a first mesh element disposed downstream from the first electron detector;
a second mesh element disposed downstream from the first mesh element, wherein the first electron detector and the first mesh element form a deceleration region, wherein the first mesh element and the second mesh element form a drift region;
an energy filter disposed downstream from the second mesh element;
a second electron-optic lens; and
a second electron detector configured to collect at least one of an additional portion of the secondary electrons or an additional portion of the backscattered electrons.

28. A system comprising:
a first emittance analyzer assembly;
a second emittance analyzer assembly; and
a third emittance analyzer assembly, wherein at least one of the first emittance analyzer assembly, the second emittance analyzer assembly or the third emittance analyzer assembly comprises:
a set of deflection optics;
a first electron-optic lens;
a first electron detector including a center aperture, wherein the first electron detector is configured to collect at least one of a portion of the secondary electrons or a portion of the backscattered electrons;
a first mesh element disposed downstream from the first electron detector;
a second mesh element disposed downstream from the first mesh element, wherein the first electron detector and the first mesh element form a deceleration region, wherein the first mesh element and the second mesh element form a drift region;
an energy filter disposed downstream from the second mesh element;
a second electron-optic lens; and
a second electron detector configured to collect at least one of an additional portion of the secondary electrons or an additional portion of the backscattered electrons.

* * * * *